US006839884B1

(12) United States Patent
Narain et al.

(10) Patent No.: US 6,839,884 B1
(45) Date of Patent: Jan. 4, 2005

(54) HIERARCHICAL FUNCTIONAL VERIFICATION

(75) Inventors: Prakash Narain, San Carlos, CA (US); Rajeev K. Ranjan, Santa Clara, CA (US); Christopher Morrison, Sunnyvale, CA (US); John M. Beardslee, Menlo Park, CA (US); Rajiv Kumar, Santa Clara, CA (US)

(73) Assignee: Real Intent, Inc., Santa Clara, CA (US)

( * ) Notice: Subject to any disclaimer, the term of this patent is extended or adjusted under 35 U.S.C. 154(b) by 213 days.

(21) Appl. No.: 09/766,189

(22) Filed: Jan. 18, 2001

(51) Int. Cl.[7] .............................. G06F 17/50; G06F 9/45

(52) U.S. Cl. ............................................... 716/5; 716/4

(58) Field of Search .......................................... 716/5, 4

(56) References Cited

U.S. PATENT DOCUMENTS

| | | |
|---|---|---|
| 5,517,432 A | 5/1996 | Chandra et al. |
| 5,604,895 A | 2/1997 | Raimi |
| 5,680,332 A | 10/1997 | Raimi et al. |
| 5,774,370 A | 6/1998 | Giomi |
| 6,009,251 A * | 12/1999 | Ho et al. .......................... 716/5 |
| 6,175,946 B1 | 1/2001 | Ly et al. .......................... 716/4 |
| 6,182,268 B1 | 1/2001 | McElvain et al. |

FOREIGN PATENT DOCUMENTS

EP     PCT/US 01/14973     3/2002

OTHER PUBLICATIONS

0–In Design Automation, New 0–In Release to Zero–In On a Wide Range of Bugs online retrieved on Jul. 8, 2002, Retrieved from the Internet: <http://www.0–in.com/subpages/news/release/php>.*
Narain, et al., "A High–Level Approach to Test Generation", Jul. 1993, pp. 483–492.
Brand et al., "Incremental Synthesis", 1994, pp. 14–18.
"Time Rover: The Formal Testing Company", Nov. 17, 1997, p. 1.
"Solidification: Static Functional Verification with Solidify", 1999, pp. 1–10.
"Solidify: Static Functional Verification for HDL Designers", Mar. 1999, 2 pages.
"New Cadence Verification Product and Methodology Services Deliver Breakthrough Productivity for SOC Verification", Downloaded from http://www.cadence.com/press_box/na/pr/1999/06_07_99.html on Jun. 1999, pp. 1–3.
"Formalized Design", Downloaded from http://www.formalized.com/prod.html on Jul. 1999, p. 1.
"Specimen Elite Data Sheet", Downloaded from http://www.verisity.com/html/default_productsspecman.html on Jul. 1999, pp. 1–2.
"0–In Methodology Overview", Downloaded from http://www.0–in.com/subpages/prodtech/index.html on Jul. 1999, pp. 1–2.
"Design INSIGHT Formal Model Checker", Downloaded from http://www.chrysalis.com/products/FMC_datasheet.htm on Jul. 1999, pp. 1–4.

(List continued on next page.)

*Primary Examiner*—Matthew Smith
*Assistant Examiner*—A. M. Thompson
(74) *Attorney, Agent, or Firm*—Faegre & Benson LLP

(57) ABSTRACT

A method and apparatus are described that facilitate validation of a hardware design having multiple hierarchical levels. In one embodiment, a representation of the hardware design is received, and the hardware design is validated by performing validation processing on a plurality of sub-problems. Each of the plurality of sub-problems covers a computationally feasible size of the hardware design at a corresponding hierarchical level. In another embodiment, validation of a hardware design includes making use of validation processing previously performed with respect to one or more modules included in the hardware design based on the hierarchical relationship between these modules and other modules included in the hardware design.

153 Claims, 11 Drawing Sheets

OTHER PUBLICATIONS

"Design INSIGHT FDRC Formal Design Rule Check Tools", Downloaded from http://www.chrysalis.com/products/FDRC_datasheet.htm on Jul. 1999, pp. 1–3.

"Datasheet: Affirma Formal Check model checker", 1 page.

"Datasheet: Affirma Coverage Analyzer", 1 page.

"Assertion Compiler: Finds Hidden Bugs in Verilog and VHDL Designs", 1999, 2 pages.

"SureThing: The Designer's Workbench", 2 pages.

"Twister: Automatic Model Checker Formal Verification of Designs Using Predefined Rules", 2 pages.

"0–In Search Data Sheet", pp. 1–3.

"0–In CheckerWare Data Sheet", pp. 1–2.

"0–In Check Data Sheet", pp. 1–3.

"0–In Design Automation Home Page", Downloaded from http://www.0–in.com/subpages/prodtech/index.html on May 8, 2000, 2 pages.

"0–In Methodology Overview", Downloaded from http://www.0–in.com/subpages/prodtech/index.html on May 8, 2000, 2 pages.

"0–In Check", Downloaded from http://www.0–in.com/subpages/prodtech/0in_check.html on May 8, 2000, 2 pages.

"0–In Technical Papers", Downloaded from http://www.0–in.com/subpages/prodtech/0in_related_techprs.html on May 8, 2000, pp. 1–3.

"0–In Search", Downloaded from http://www.0–in.com/subpages/prodtech/0in_search.html on May 8, 2000, pp. 1–2.

Anderson T., "Using VCS with White–Box Verification Techniques", SNUG San Jose 2000, pp. 1–9.

Switzer et al., "Functional Verification with Embedded Checkers", 5 pages.

Switzer et al., "Using Embedded Checkers to Solve Verification Challenges", pp. 1–20.

Goering, R., "Verification Start–Up Seeks Design Intent," EE Times Article, Apr. 24, 2000. Downloaded from http://www.realintent.com/news/current/a000424_eet.html.

Morrison, G., "Method Gives Pre–Synthesis, Pre–Simulation Report On RTL Flaws," Electronic News, May 1, 2000. Downloaded http://www.realintent.com/news/current/a000501_enews.html.

"Twister (Automated Model Checking)" EE Times about Twister & Tornado, Printed Jun. 16, 1999.

Real intent, "Intent–Driven Verification," Whitepaper On A Revolutionary Approach For Functional Verification Of Digital Designs, 8 pages.

Switzer, et al., "Functional Verification with Embedded Checkers." 3 Pages.

"0–In Ships Industry's First White–Box Verification Tool," 0–In Design Automation, Inc.

Chandra, et al., "Architectural Verification of Processors Using Symbolic Instruction Graphs." Proceedings, IEEE International Conference on Computer Design: VLSI in Computers and Processors, Cambridge, Massachusetts, Oct. 10–12, 1994.

Keutzer, Kurt, "The Need for Formal Verification in Hardware Design and What Formal Verification Has Not Done for Me Lately." Proceedings of the 1991 International Workshop on the HOL Theorem Proving System and Its Applications, Davis, California, Aug. 28–30, 1991.

Levitt, et al., "A Scalable Formal Verification Methodology for Pipelined Microprocessors." Proceedings 1996 33rd Design Automation Conference, Las Vegas, Nevada.

Moundanos, et al., "Abstraction Techniques for Validation Coverage Analysis and Test Generation." IEEE Transactions on Computers, vol. 47, No. 1, Jan. 1998.

Jones et al., "Self–Consistency Checking." Intl. Conf. On Formal Methods in Computer–Aided Design (PMCAD), 1996.

Naik, et al., "Modeling and Verification of a Real Life Protocol Using Symbolic Model Checking."

Eiriksson, et al., "Integrating Formal Verification Methods with a Conventional Project Design Flow." 33rd Design Automation Conference, Las Vegas, Nevada, Proceedings 1996.

Beer, et al., "Methodology and System for Practical Formal Verification of Reactive Hardware." 6th International Conference, CAV '94, Jun. 21–23, 1994.

Balarin, "Formal Verification of Embedded Systems Based on CFSM Networks." 33rd Design Automation Conference, Las Vegas, Nevada, Proceedings 1996.

Ho, Chain–Min Richard, "Validation Tools for Complex Digital Designs." Department of Computer Science and the Committee on Graduate Studies of Stanford University in Partial Fulfillment of the Requirements for the Degree of Doctor of Philosophy, Nov. 1996.

Burch, et al., "Automatic Verification of Pipelined Microprocessor Control." Conference on Computer–Aided Verification, Jun. 21–23, 1994. 1995.

Hoskote, et al., "Automatic Extraction of the Control Flow Machine and Application to Evaluating Coverage of Verification Vectors." International Conference on Computer Design: VLS in Computers & Processors, Oct. 2–4, 1995.

Chang, Y.S., "Verification Of A Microprocessor Using Real World Applications," 4 pages.

Goldberg, E. J., et al., "Combinatorial Verification Based on High–Level Functional Specifications," Candace Berkeley Laboratories, Department of Electrical Engineering and Computer Sciences, 6 pages.

Morrison, G., "Method Gives Pre–Synthesis, Pre–Simulation Report On RTL Flaws," Shrinking Design Times, Electronic News, May 1, 2000, available: http://www.realintent.com/news/current/a000501_enews.html.

Twister (Automated Model Checking), Verysys, 3 pages, available: http://www.verysys.com/.../twister_automated_model_checke.htm.

Van Eijk, C. A. J.,et al., "Exploiting Functional Dependencies in Finite State Machine Verification," IEEE, 1996, 6 pages.

York, G., "An Integrated Environment For HDL Verification," IEEE, 1995, 10 pages.

* cited by examiner

DESIGN 700

US 6,839,884 B1

HIERARCHICAL FUNCTIONAL VERIFICATION

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

BACKGROUND OF THE INVENTION

1. Field of the Invention

The invention relates generally to the field of design verification. More particularly, the invention relates to a new approach for functional verification of digital designs.

2. Description of the Related Art

The objective of design verification is to ensure that errors are absent from a design. Deep sub-micron integrated circuit (IC) manufacturing technology is enabling IC designers to put millions of transistors on a single IC. Following Moore's law, design complexity is doubling every 12–18 months, which causes design verification complexity to increase at an exponential rate. In addition, competitive pressures are putting increased demands on reducing time to market. The combination of these forces has caused an ever worsening "verification crisis".

Today's design flow starts with a specification for the design. The designer then implements the design in a language model, typically Hardware Description Language (HDL). This model is typically verified to discover incorrect input/output (I/O) behavior via a stimulus in expected results out paradigm at the top level of the design.

By far the most popular method of functional verification today, simulation-based functional verification, is widely used within the digital design industry as a method for finding defects within designs. A very wide variety of products are available in the market to support simulation-based verification methodologies. However, a fundamental problem with conventional simulation-based verification approaches is that they are vector and testbench limited.

Simulation-based verification is driven by a testbench that explicitly generates the vectors to achieve stimulus coverage and also implements the checking mechanism. Testbenches create a fundamental bottleneck in simulation-based functional verification. In order to verify a design hierarchy level, a testbench must be generated for it. This creates verification overhead for coding and debugging the testbench. Hence, a significant amount of expensive design and verification engineering resources are needed to produce results in a cumbersome and slow process.

Several methods have been attempted by Electronic Design Automation (EDA) companies today in order to address the shortcomings of simulation. However, none of these attempts address this fundamental limitation of the process. For example, simulation vendors have tried to meet the simulation throughput challenge by increasing the performance of hardware and software simulators thereby allowing designers to process a greater number of vectors in the same amount of simulation time. While this does increase stimulus coverage, the results are incremental. The technology is not keeping pace with the required growth rate and the verification processes are lagging in achieving the required stimulus coverage.

Formal verification is another class of tools that has entered the functional verification arena. These tools rely on mathematical analysis rather than simulation of the design. The strong selling point of formal verification is the fact that the results hold true for all possible input combinations to the design. However, in practice this high level of stimulus coverage has come at the cost of both error coverage and particularly usability. While some formal techniques are available, they are not widely used because they typically require the designer to know the details of how the tool works in order to operate it.

In addition to the above deficiencies, the conventional tools are limited in their capacity to handle complex hardware designs. Currently, hardware designs are analyzed monolithically. In other words, at any level of hierarchy in the design, all the modules that constitute the hierarchy are analyzed together. However, analyzing all the modules together may not be feasible in large designs due to the resulting computational complexity. Furthermore, the existing tools lack the ability to provide the verification process as the design evolves, i.e., in concurrence with the design process. For instance, simulation can be applied only after the first full-chip integration.

Therefore, a verification methodology is needed that can avoid computational complexity problems when analyzing complex hardware designs and can be applied concurrently with the design process.

BRIEF SUMMARY OF THE INVENTION

A method and apparatus are described that facilitate validation of a hardware design having multiple hierarchical levels. According to one aspect of the present invention, a representation of the hardware design is received, and the hardware design is validated by performing validation processing on a plurality of sub-problems. Each of the plurality of sub-problems covers a computationally feasible size of the hardware design at a corresponding hierarchical level. According to another aspect of the present invention, validation of a hardware design includes making use of validation processing previously performed with respect to one or more modules within the hardware design based on the hierarchical relationship between these modules and other modules included in the hardware design.

Other features of the present invention will be apparent from the accompanying drawings and from the detailed description that follows.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1:
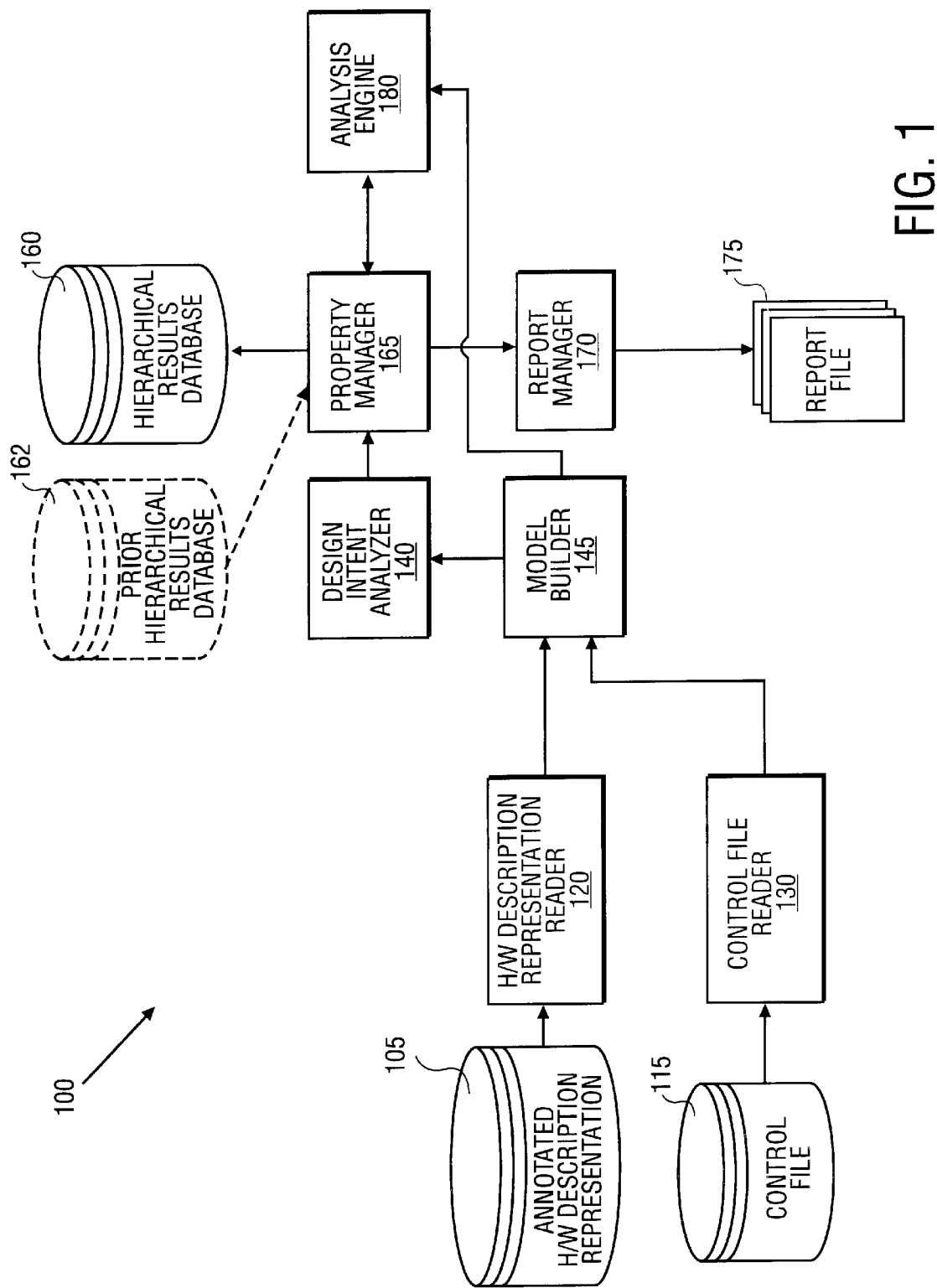
FIG. 1 is a block diagram illustrating an exemplary architecture of an Intent-Driven Verification system according to one embodiment of the present invention.

A method and apparatus for performing hierarchical functional verification of a hardware design are described. In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention includes various steps, which will be described below. The steps of the present invention may be performed by hardware components or may be embodied in machine-executable instructions, which may be used to cause a general-purpose or special-purpose processor programmed with the instructions to perform the steps. Alternatively, the steps may be performed by a combination of hardware and software.

The present invention may be provided as a computer program product that may include a machine-readable medium having stored thereon instructions, which may be used to program a computer (or other electronic devices) to perform a process according to the present invention. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

For convenience, embodiments of the present invention will be described with reference to Verilog and VHDL. However, the present invention is not limited to any particular representation of a hardware design. For example, the language representation of a hardware design may be in the C programming language, C++, derivatives of C and/or C++, or other high-level languages. In addition, while embodiments of the present invention are described with reference to functional verification of hardware designs, aspects of the present invention are equally applicable to other types of design activities as well, such as hardware synthesis, design optimization, design simulation and performance analysis. Furthermore, while embodiments of the present invention are described with reference to the provision of augmented design information by way of hardware description language (HDL) annotations, it is contemplated that the augmented design information could reside in a file separate from the file containing the HDL. Alternatively, a new HDL could be developed having semantics capable of capturing the augmented design information.

Terminology

Before describing an illustrative design verification environment in which various embodiments of the present invention may be implemented, brief definitions of terms used throughout this application are given below.

A "design" is defined as a description of a collection of objects, such as modules, blocks, wires, registers, etc. that represent a logic circuit.

A design may be expressed in the form of a language. For example, a hardware description language (HDL), such as Verilog or VHDL can be used to describe the behavior of hardware as well as its implementation.

As used herein an "annotation" refers to text embedded in a language construct, such as a comment statement or remark. Most programming languages have a syntax for creating comments thereby allowing tools designed to read and/or process the programming language to read and ignore the comments.

"Simulation" is generally the process of evaluating design behavior for a set of input conditions to draw approximate conclusions about the behavior of many different attributes of the design.

"Formal analysis" generally refers to the process of analyzing a design for all possible input conditions to derive definite conclusions about the behavior of an attribute with respect to the design.

"Functional verification" generally refers to the process of applying stimuli to a design under test with appropriate checking mechanisms to either detect a defect in the design or to establish that the functionality performs as expected. Typically, the three key components of a functional verification process are the applied stimulus, the checking mechanism, and the user's ability to both run the process and debug the results. As will be described later, the effectiveness of a functional verification process may be measured in terms of the following three metrics: (1) error coverage, (2) stimulus coverage, and (3) usability.

The term "design intent" generally refers to what the designer intends in terms of the interaction between components of the design and the designer's expectations regarding acceptable functional behavior. For example, the designer may intend a particular flow of logical signals among the variables of an RTL design description (the intended flow). Traditionally, design intent has referred to input constraints, internal constraints, and/or cause and effect modeling. In contrast, as used herein the term "design intent" includes "implied design intent" and additional forms of "expressed design intent." Expressed design intent generally refers to design intent explicitly conveyed by a designer by way of intent modeling semantics in a control file or embedded within annotations of RTL source code (the hardware design representation), for example. Examples of expressed design intent regarding the intended flow of logical signals may include the intended temporal behaviors (e.g., the ACK signal must go high within 4 cycles of the REQ signal) and the intended data flow relationships (e.g., the data being loaded from the input port is the data intended for transfer by the driver of the input port). Implied design intent generally refers to design intent that is inferred from the design description including expected behaviors that should occur within standard design practices.

A "property" is a condition or statement, typically expressed in terms of a relationship among a group of one or more signals in a hardware design, that must hold for the hardware design to function as intended. According to one embodiment, violations are reported at the property-level rather than at the more detailed level of design verification checks.

The term "design verification check" or simply "check" generally refers to a mechanism for verifying a property. Properties may be composed of one or more checks, which are the atomic units that are verified. That is, properties may be broken down into one or more checks. Since properties and checks are sometimes equivalent (i.e., when a property comprises a single design verification check), these terms may at times be used interchangeably. Examples of checks include, but are not limited to: monitors, Boolean conditions, sensitized path conditions, and the like. According to one embodiment, a comprehensive set of checks may be automatically formulated based upon a representation of the hardware design and information regarding the intended flow of logical signals among a plurality of variables in the representation.

Check A is said to be "dependent" upon checks B, C, and D if it is impossible to violate check A without violating at least one of checks B, C, and D. If check A is dependent upon check B, C and D, then a "dependency relationship" exists between check A and checks B, C, and D.

An Exemplary Intent-Driven Verification System

FIG. 1 is a block diagram illustrating an exemplary architecture of an Intent-Driven Verification (IDV) system according to one embodiment of the present invention. According to the embodiment depicted, the IDV system 100 includes an annotated hardware design representation reader 120. The annotated hardware design representation reader 120 may be a conventional RTL reader with the additional ability to recognize and process augmented design information. Alternatively, the annotated hardware design representation reader 120 may be a conventional C or C++ parser capable of processing the augmented design information. In one embodiment, the augmented design information comprises annotations embedded within the hardware design representation 105, such as an annotated RTL source code file 105 containing special verification semantics (directives). Exemplary directives and their syntax are described further below. In alternative embodiments, the augmented design information may be included in a control file associated with the hardware design representation 105, such as control file 115.

The IDV system 100 also includes a control file reader 130. The control file reader 130 may be a conventional control file reader. Alternatively, in the case that the augmented design information (e.g., information regarding design intent, such as the intended flow of logical signal among variables in the hardware design representation) is to be provided by way of control file 115, then the control file reader 130 additionally includes parsing functionality enabling the control file reader 130 to recognize and process the augmented design information.

According to the architecture depicted, the IDV system 100 also includes a model builder 145, a design intent analyzer 140, a property manager 165, an analysis engine 180, and a report manager 170. The model builder 145 receives output of the hardware design representation reader 120, the control file reader 130, and a cell library (not shown) and builds an internal representation of the hardware design, a model.

The design intent analyzer 140 automatically produces a comprehensive set of design verification checks, such as behavioral integrity checks and temporal integrity checks, based upon a predetermined set of properties. The design intent analyzer 140 enables verification while the design is being developed and facilitates detection of design defects at the RTL-level. Importantly, automatic formulation of a comprehensive set of design verification checks not only dramatically reduces verification effort and time but also significantly increases design robustness.

The property manager 165 maintains information regarding relationships among the checks generated by the design intent analyzer and additionally maintains information regarding relationships among properties and whether the properties are satisfied, violated, or whether the results are indeterminate or conditional upon one or more other properties. According to one embodiment, the property manager 165. According to one embodiment, the property manger 165 and analysis engine 180 cooperate to determine dependency relationships among the comprehensive set of design verification checks. As described further below, the dependency relationships (or "linking" information) may be used to facilitate error reporting or used to streamline check processing.

The property manager 165 stores all of the above information or a portion of the above information in a hierarchical results database 160. In one embodiment, a set of design verification checks is created to validate the design, and information pertaining to the set of design verification checks is stored in the hierarchical results database 160. As each of these checks is being evaluated, the hierarchical results database 160 is updated to indicate whether the check can be violated. In one embodiment, prior results obtained during the evaluation process previously performed with respect to lower hierarchical levels of the design are automatically inherited by higher levels of the design hierarchy, thereby minimizing the verification overhead required at various hierarchical levels of the design. In one embodiment, the prior results are stored in a prior hierarchical results database 162. Alternatively, the prior hierarchical results database 162 is a part of the hierarchical results database 160.

The analysis engine 180 verifies the model produced by the model builder by testing for violations of the properties. Preferably, the analysis engine 180 employs an analysis-based technique, such as an integration of simulation and formal analysis methodologies, so as to maximize stimulus coverage for the design under test. However, in alternative embodiments, simulation, functional verification, or other well-known verification methodologies may be employed individually.

The report manager 170 provides feedback to the designer, in the form of a report file 175, for example, regarding potential design defects. It should be noted that a single error in the hardware design might lead to a violation of 25 to 30 or more different design verifications checks. There is no point in reporting every violation if the user has already been notified that an error exists. Therefore, according to one embodiment, an intent violation hierarchy may be maintained when reporting design defects. In this manner, redundancy of reported information is contained. Multiple intent violations due to a common defect are not reported. This minimizes the amount of data to be analyzed to detect defects.

High-Level Intent-Driven Verification Processing

Figure 2:
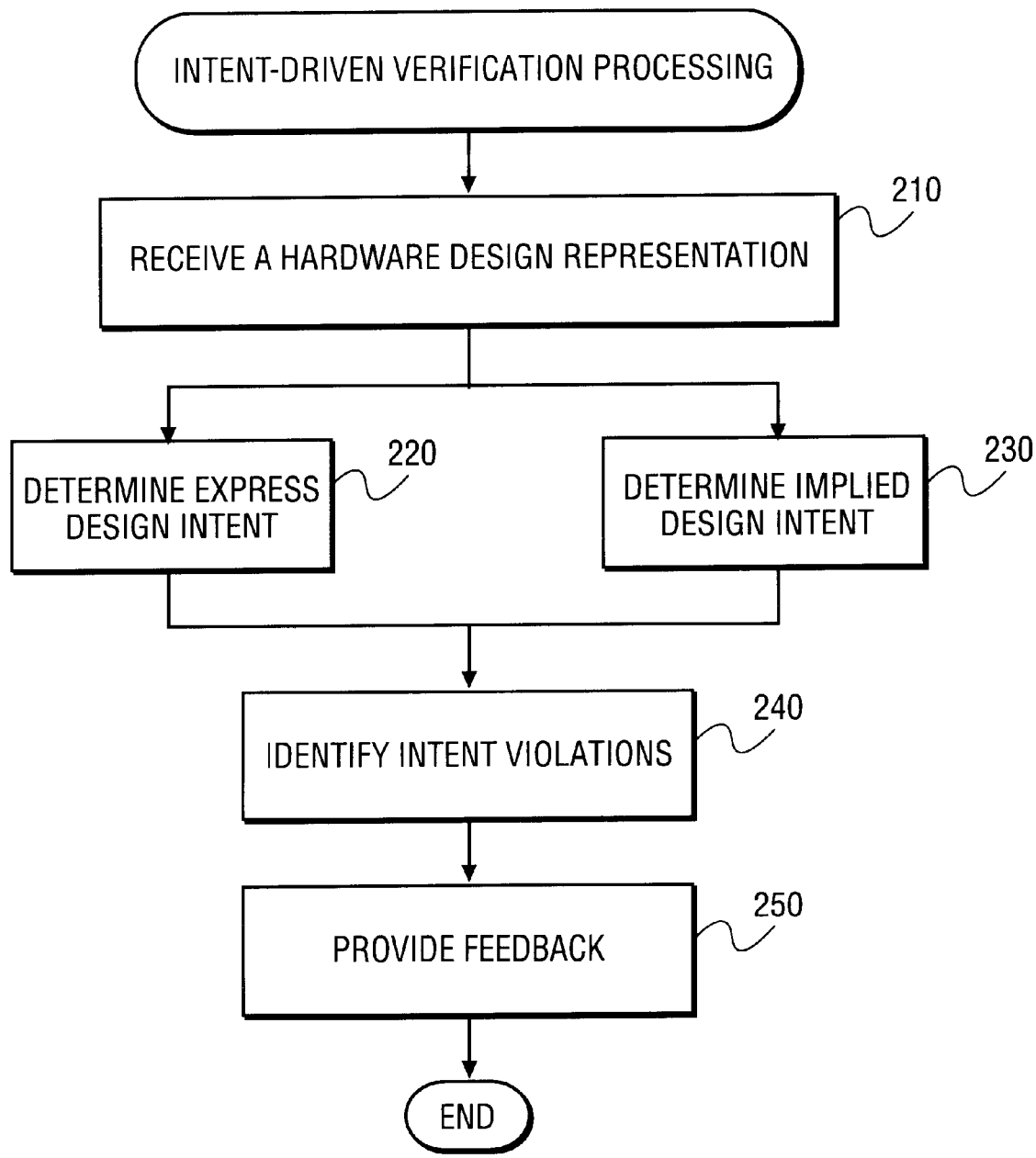
FIG. 2 is a high-level flow diagram illustrating an Intent-Driven Verification processing according to one embodiment of the present invention.

FIG. 2 is a high-level flow diagram illustrating Intent-Driven Verification processing according to one embodiment of the present invention. The Intent-Driven Verification process generally breaks down into three fundamental technologies, intent capture, intent gap detection, and intent violation reporting. A method for capturing the designer's intent for the design (intent capture) is represented by processing blocks 210–230, detection of areas within the design source code that differ from the original design intent (intent gap detection) comprises processing block 240, and identification and reporting of the space between the designer's intent and the design's implementation (intent violation reporting) is represented by processing block 250. Briefly, after a complete view of the overall design intent is captured, e.g., after the two forms of intent are integrated together by the design intent analyzer 140, the analysis engine 180 may begin identifying individual intent violations. When the analysis is complete, the report manager 170 provides feedback to the user in a well-organized manner. In one embodiment, the processing blocks described below may be performed under the control of a programmed processor, such as processor 302. However, in alternative embodiments, the processing blocks may be fully or partially implemented by any programmable or hardcoded logic, such as Field Programmable Gate Arrays (FPGAs), TTL logic, or Application Specific Integrated Circuits (ASICs), for example.

Intent-Driven Verification processing begins at processing block 210 where a language representation of a hardware design under test is received. The language representation may be RTL source code, such as Verilog or VHDL. Preferably, to take advantage of the control flow structure of the language representation, augmented design information is provided by inline annotations to the language representation of the hardware design, e.g., annotated RTL 105. However, in alternative embodiments, design intent may be provided in the control file 115.

In this example, at processing blocks 220 and 230, the design intent is captured in two basic forms: expressed and implied. Expressed design intent is design intent that is explicitly stated by the designer. The implementation of IDV described herein may use an elegant RTL-based method to express this intent in an annotated RTL source code file, such as annotated hardware description representation 105, and/or the control file 115. Regardless of their source, the expressed design intent is determined based upon the annotations. Importantly, the form of intent modeling provided herein is very intuitive and does not require the users to learn a new language. Additionally, this intent modeling captures the intent in a concise manner and thereby minimizes setup effort. Typically, the expressed intent defines the interaction between components of the design and/or the designer's expectations regarding acceptable functional behavior. Implied design intent may be inferred directly from the design description. Advantageously, implied intent capture infers numerous and complex design behaviors automatically without requiring a designer to explicitly state them. Typically, this consists of expected behaviors that should occur within standard design practices.

At processing block 240, the intent gap is identified based upon the design intent and the design implementation. In the example depicted, the two forms of design intent are integrated and used as input to processing block 240. In alternative embodiments, the intent gap may be determined for only a single form of design intent or one or more other combinations of subsets of expressed and implied design intent. At any rate, preferably, the intent gap is statically identified using functional verification techniques. The intent gap is the distance between a design's intent and the actual implementation. According to one embodiment, IDV detects the intent gap in terms of individual intent violations. Intent violations are the result of defects within the design implementation. Importantly, because the intended behavior of the design is well understood, intent violations isolate design defects with high localization to their source.

At processing block 250, feedback is provided to the user. For example, one or more report files 175 may be created that provide information regarding the individual intent violations identified in processing block 240. Preferably, the redundancy of information is contained and the intent violation data is organized into a format that provides useful and highly accurate debugging information to a designer. Additionally, sequential debugging information may be provided along with detailed explanations of any identified intent violations.

An Exemplary Computer Architecture

Figure 3:
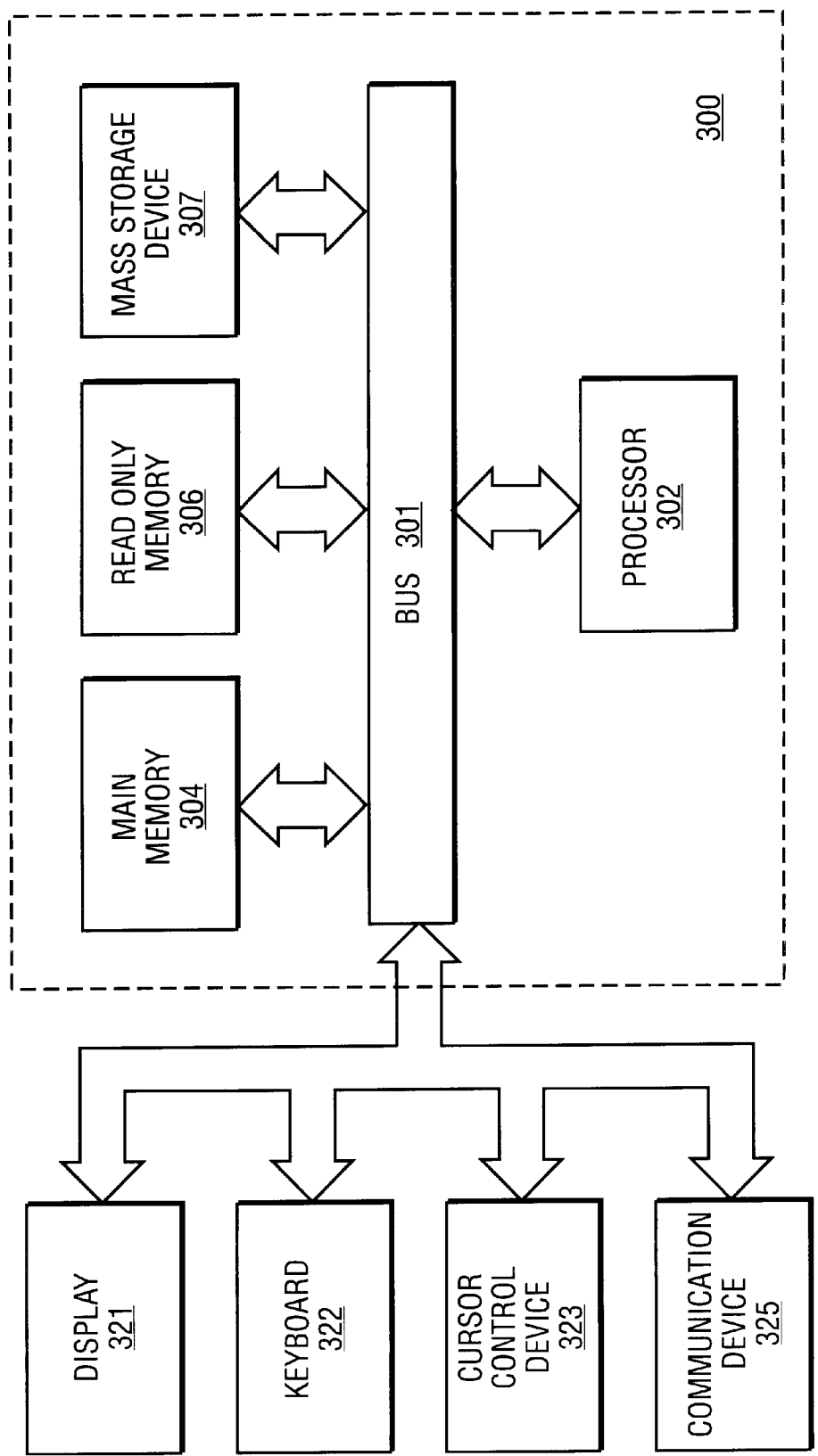
FIG. 3 is an example of a computer system upon which one embodiment of the present invention may be implemented.

Having briefly described an exemplary verification system in which various features of the present invention may be employed and high-level Intent-Driven Verification processing, an exemplary machine in the form of a computer system 300 representing an exemplary workstation, host, or server in which features of the present invention may be implemented will now be described with reference to FIG. 3. Computer system 300 comprises a bus or other communication means 301 for communicating information, and a processing means such as processor 302 coupled with bus 301 for processing information. Computer system 300 further comprises a random access memory (RAM) or other dynamic storage device 304 (referred to as main memory), coupled to bus 301 for storing information and instructions to be executed by processor 302. Main memory 304 also may be used for storing temporary variables or other intermediate information during execution of instructions by processor 302. Computer system 300 also comprises a read only memory (ROM) and/or other static storage device 306 coupled to bus 301 for storing static information and instructions for processor 302.

A data storage device 307 such as a magnetic disk or optical disc and its corresponding drive may also be coupled to computer system 300 for storing information and instructions. Computer system 300 can also be coupled via bus 301 to a display device 321, such as a cathode ray tube (CRT) or Liquid Crystal Display (LCD), for displaying information to an end user. For example, graphical and/or textual depictions/indications of design errors, and other data types and information may be presented to the end user on the display device 321. Typically, an alphanumeric input device 322, including alphanumeric and other keys, may be coupled to bus 301 for communicating information and/or command selections to processor 302. Another type of user input device is cursor control 323, such as a mouse, a trackball, or cursor direction keys for communicating direction information and command selections to processor 302 and for controlling cursor movement on display 321.

A communication device 325 is also coupled to bus 301. Depending upon the particular design environment implementation, the communication device 325 may include a modem, a network interface card, or other well-known interface devices, such as those used for coupling to Ethernet, token ring, or other types of physical attachment for purposes of providing a communication link to support a local or wide area network, for example. In any event, in this manner, the computer system 300 may be coupled to a number of clients and/or servers via a conventional network infrastructure, such as a company's Intranet and/or the Internet, for example.

Hierarchical Functional Verification

As discussed in the Background Section of this Specification, conventional design verification tools analyze hardware designs monolithically. That is, all the modules are analyzed together. However, analyzing all the modules together may not be feasible in large or complex designs due to the resulting computational complexity. Thus, the conventional tools are limited in their capacity to handle hardware designs of larger sizes and significant complexity. The present invention provides an approach that avoids the above problems by keeping the computational complexity of a hierarchical hardware design under control during the entire verification process.

Figure 4:
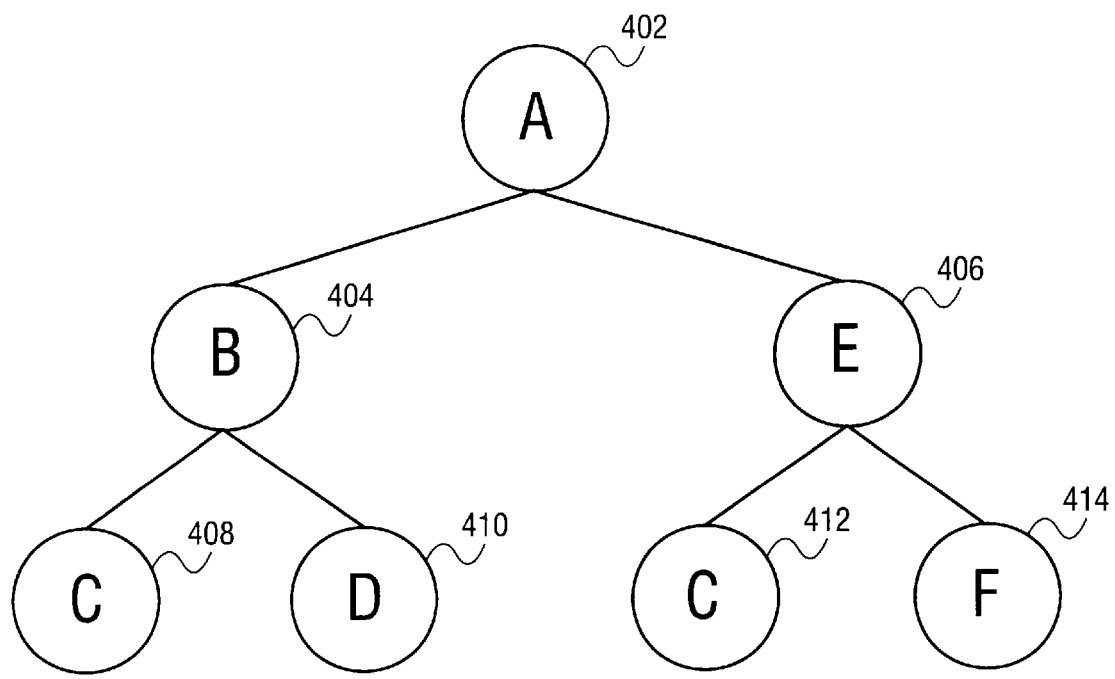
FIG. 4 illustrates an exemplary hierarchical hardware design.

FIG. 4 illustrates an exemplary hierarchical hardware design 400. The hardware design 400 includes multiple hierarchical levels. Each hierarchical level consists of one or more modules that hierarchically relate to other modules in the hardware design. As shown in FIG. 4, module 402 at the highest level of the design hierarchy represents the entire hardware design 400 and includes modules 404 and 406 which, in turn, consist of lower level modules 408, 410, 412 and 414. Although the hardware design 400 is depicted as including three hierarchical levels, more or less hierarchical levels and modules may be contained in a hardware design verified using the approach of the present invention.

For every design module, a set of properties needs to be verified to determine whether the hardware design 400 functions as intended. Verifying each property in the context of the entire design 400 creates a problem of a significant complexity that may be computationally infeasible to solve. Limiting the context for verifying each property allows the BDV system 100 to resolve computational complexity issues arising in validations of complex hardware designs. Specifically, the IDV system 100 divides the entire design 400 into smaller portions and creates a plurality of sub-problems for the design 400. Each sub-problem covers a computationally feasible design size. The IDV system 100 then validates the hardware design 400 by performing validation processing on the resulting sub-problems, thereby avoiding the computational complexity issues discussed above.

Figure 5:
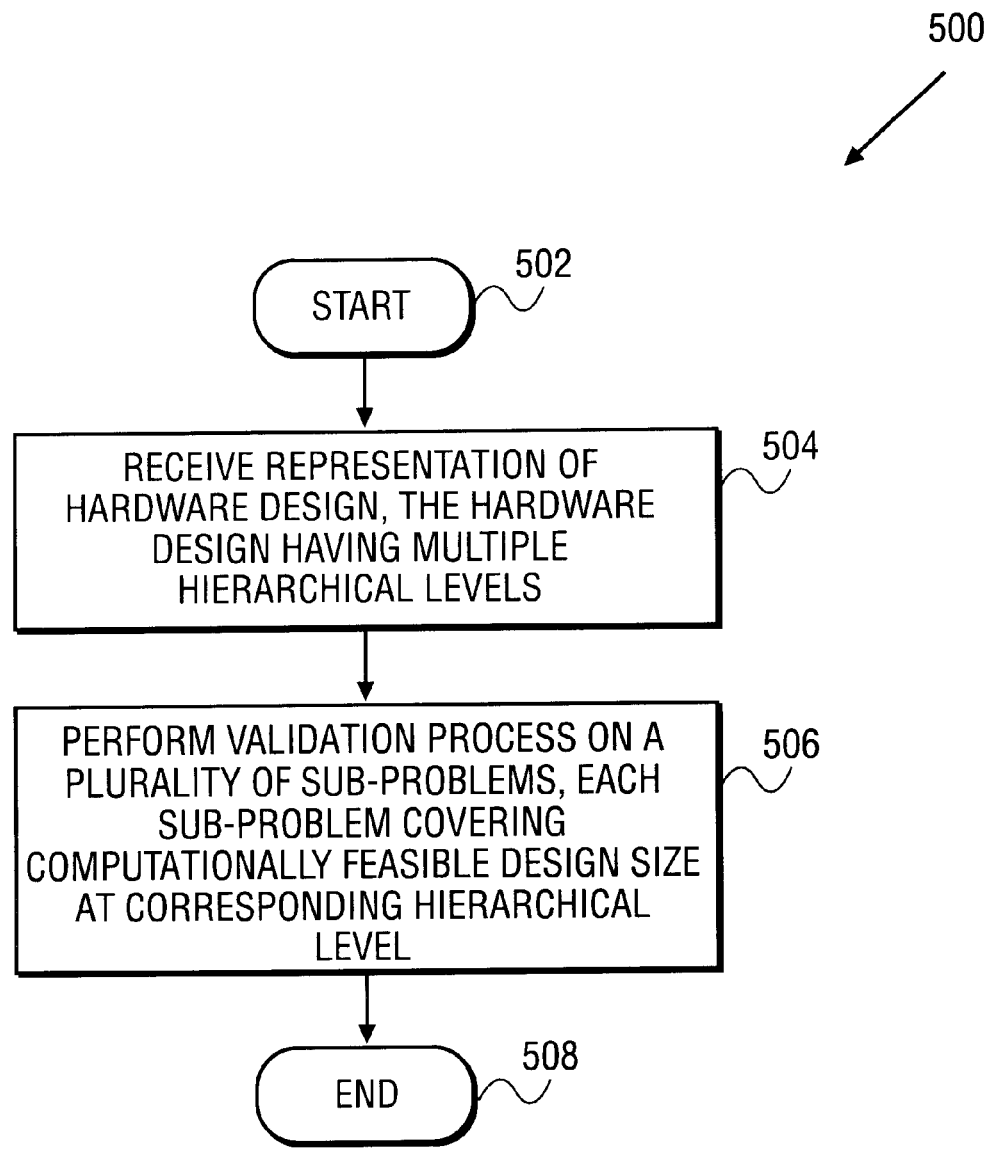
FIG. 5 is a high-level flow diagram of a process for functional verification of a design, according to one embodiment of the present invention.

FIG. 5 is a high-level flow diagram of a process for functional verification of a hardware design, according to one embodiment of the present invention. The functional verification process begins at processing block 504 where a language representation of the hardware design being tested is received. The hardware design includes multiple hierarchical levels as illustrated in FIG. 4. In one embodiment, the hardware design is represented by a hardware design language (HDL). Alternatively, the language representation of the hardware design may be in the C programming language, C++, derivatives of C and/or C++, or other high-level languages.

At processing block 506, the hardware design is validated by performing validation processing on a plurality of sub-problems. Each sub-problem is automatically formulated to cover a computationally feasible size of the hardware design at a corresponding level of the design hierarchy. In one embodiment, a sub-problem may cover a module or a pair of modules having a common interface. Alternatively, a sub-problem is formulated to cover a portion of a module or a design. In either embodiment, a sub-problem covers the smallest design size which can result in a determination that violation of a certain property is impossible or that no intent gap exists between the designer's intent and the actual design implementation with respect to this property.

Figure 6:
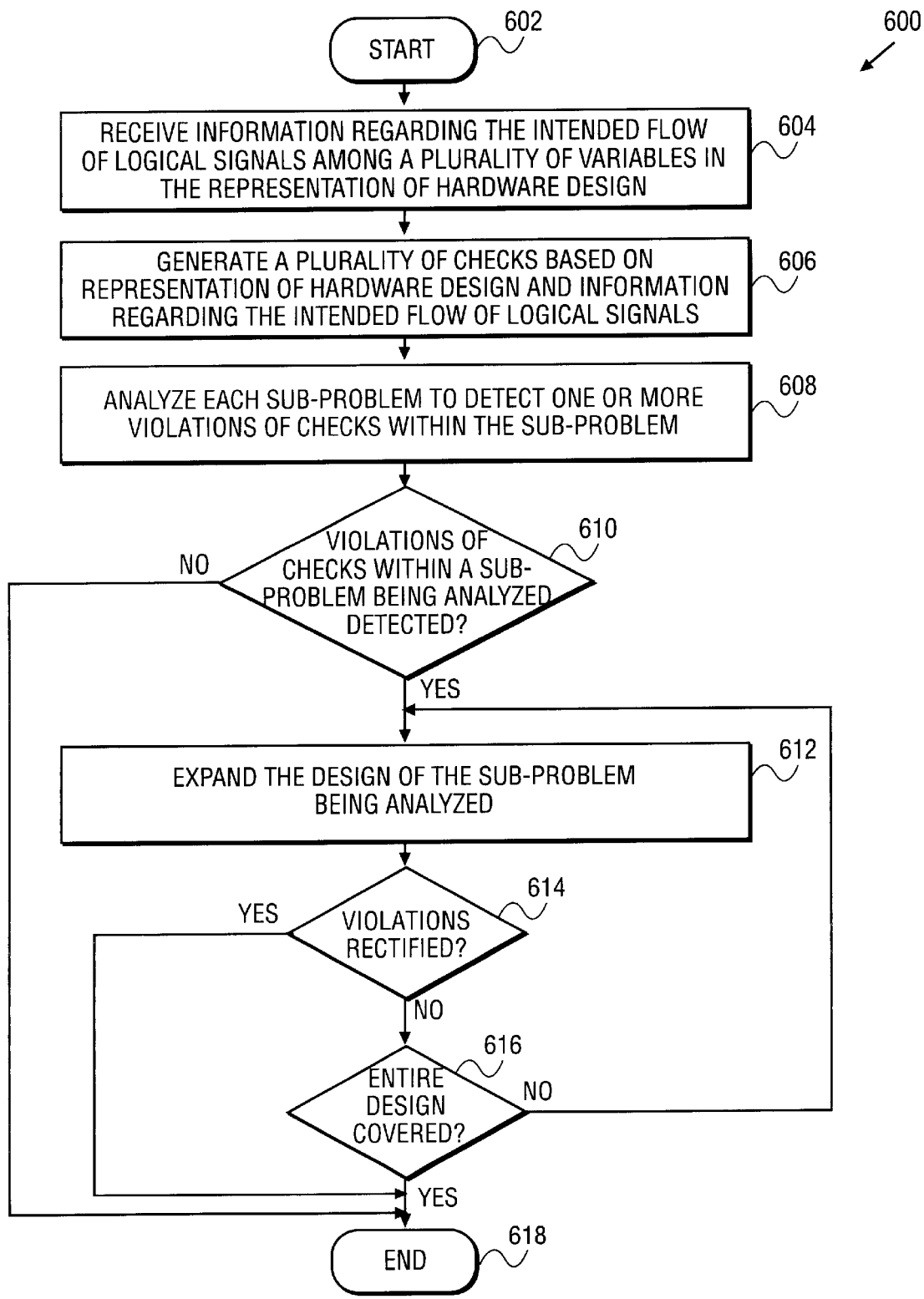
FIG. 6 is a flow diagram of one embodiment of a process that illustrates processing block 506 of FIG. 5.

FIG. 6 is a flow diagram of one embodiment of a process that illustrates processing block 506 of FIG. 5. Validation processing begins at processing block 604 where information regarding the intended flow of logical signals within the hardware design is received. At processing block 606, a plurality of checks is generated based on the representation of the hardware design and the information regarding the intended flow of logical signals. Each check is generated to detect one or more errors in the intended flow of logical signals. In one embodiment, the checks are combined into sub-problems. Each sub-problem covers a number of checks that are chosen to detect a potential violation of a property or a condition set by the designer. For instance, if the designer's intent is that two design elements A and B are never equal to each other, the minimum number of checks that would allow to conclude that A is not equal to B will be combined to formulate a sub-problem.

At processing block 608, each sub-problem is analyzed to detect one or more violations of checks included in the sub-problem. If no violations within the sub-problem being analyzed are detected, then the portion of the hardware design covered by the sub-problem functions as intended and no more analysis of this design portion is needed. Otherwise, if a violation of a check is detected, the evaluation of this check should continue because the violation may not exist in the context of the entire design. For instance, referring to the above example with A and B, the sub-problem being analyzed may include three variables: A, B and C. During the evaluation of the sub-problem, a determination may be made that A is equal to 1 and B may be either 1 or 0 depending on the value of variable C. Thus, in the limited context of this sub-problem, A may be equal to B. However, in the expanded context of the entire design, C may never receive a value that would set B to 1, thereby making the violation of the required condition impossible.

At decision box 610, a determination is made as to whether a violation of any check within the sub-problem being analyzed is detected. If the determination is negative, the analysis of the sub-problem ends. Alternatively, if the determination is positive, at processing block 612, the design size of the sub-problem is extended to attempt to rectify the detected violations. For example, referring to FIG. 4, if a sub-problem covers module 408, and analysis of the sub-problem results in detection of three violations within the module 408, the design size of the sub-problem may be extended to make an effort to rectify the detected violations. For instance, module 408 may be combined with module 410 which has a common interface with module 408, and the violated checks may then be reevaluated within the extended context of the combined modules 408 and 410. It should be noted that the IDV system 100 ensures that the extended design size remains computationally feasible.

Returning to FIG. 6, at processing block 614, a determination is made as to whether the detected violations are rectified within the extended design size. If the determination is positive, the analysis of the corresponding design portion ends. Alternatively, a further determination is made as to whether the extended design size includes the entire design (processing block 616). If the entire design is covered, the validation of the design completes, and the remaining violated checks are reported as errors in the hardware design. Otherwise, the process returns to processing block 612 and continues until either all the violations are rectified or the entire design is covered.

Figure 7:
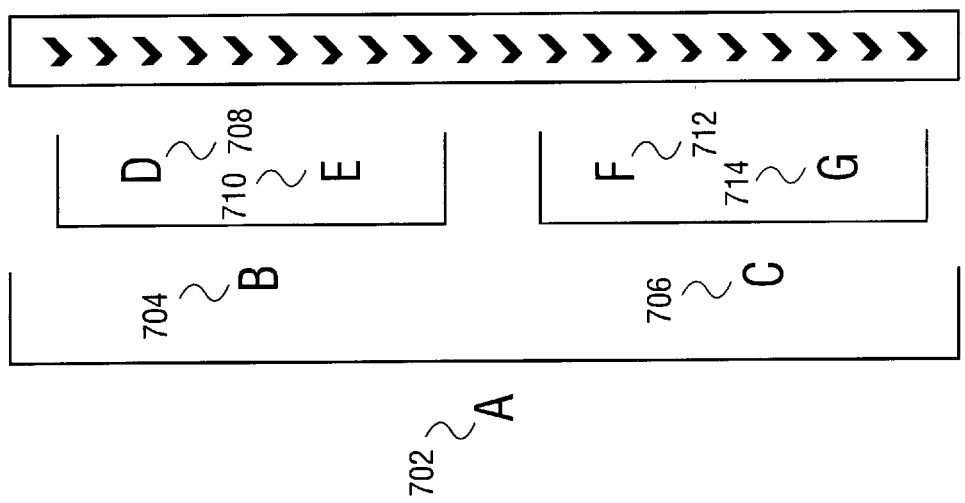
FIG. 7 illustrates a process of maintaining a database for a hardware design, according to one embodiment of the present invention.
Figure 7:
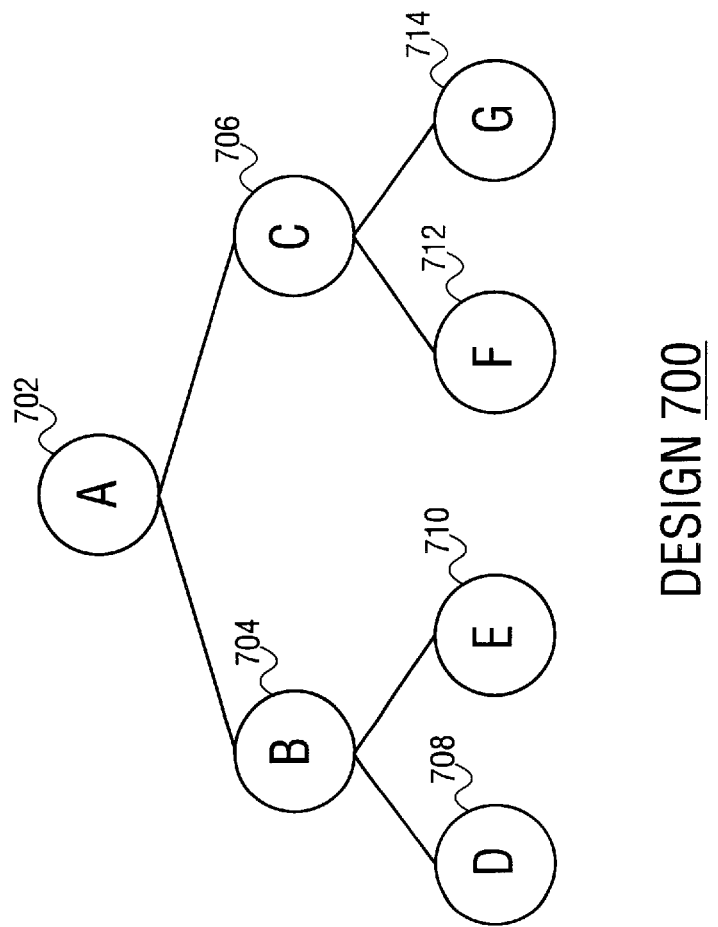

In one embodiment, a database is maintained when validating a hardware design. FIG. 7 illustrates a process of maintaining a database for a hardware design 700, according to one embodiment of the present invention. The hardware design 700 consists of multiple modules 702–714 at various levels of the design hierarchy. Validation processing begins with preparing a database (e.g., the hierarchical results database 160) for the hardware design 700. Next, when a list 720 of checks is generated, it is included in the database 160. The checks from the list are then used to formulate a plurality of sub-problems as discussed above. For instance, each sub-problem can cover one of the modules 708–714. The sub-problems are then evaluated, and the database 160 is updated with the evaluation results. In one embodiment, a check is marked as "passed" if no violation of the check is detected or as "failed" if a violation of the check is detected. The checks that did not pass the evaluation are then further analyzed within the expanded context. For instance, if a number of checks associated with module 708 fail the evaluation process, module 708 can be combined with module 710 to reevaluate the failed checks within the expanded context. The reevaluation results are then included in the database 160. If during the reevaluation some of the failed checks still do not pass the reevaluation, modules 708 and 710 can be combined with module 712 to further expand the context, etc. When validation processing completes, the database 160 contains information identifying all the checks and indicating which checks were violated within the context of the entire design 700. These resulting violations are then reported as errors in the design 700.

Inheriting Prior Results

In one embodiment, validation of a hardware design includes automatically inheriting results of validation processing previously performed with respect to any module within a hardware design. In one embodiment, the results are obtained when validating lower levels of the design hierarchy and inherited by higher levels of the design hierarchy. Alternatively, the design may include identical modules. When one of the identical modules is validated, the results are inherited by the rest of the identical modules. Automatic inheritance of prior results allows the IDV system 100 to reduce the verification cycle time and resource requirements. In addition, using automatic inheritance of prior results allows the verification process to be concurrent with the design process, thereby making incremental full-chip verification possible.

Figure 8:
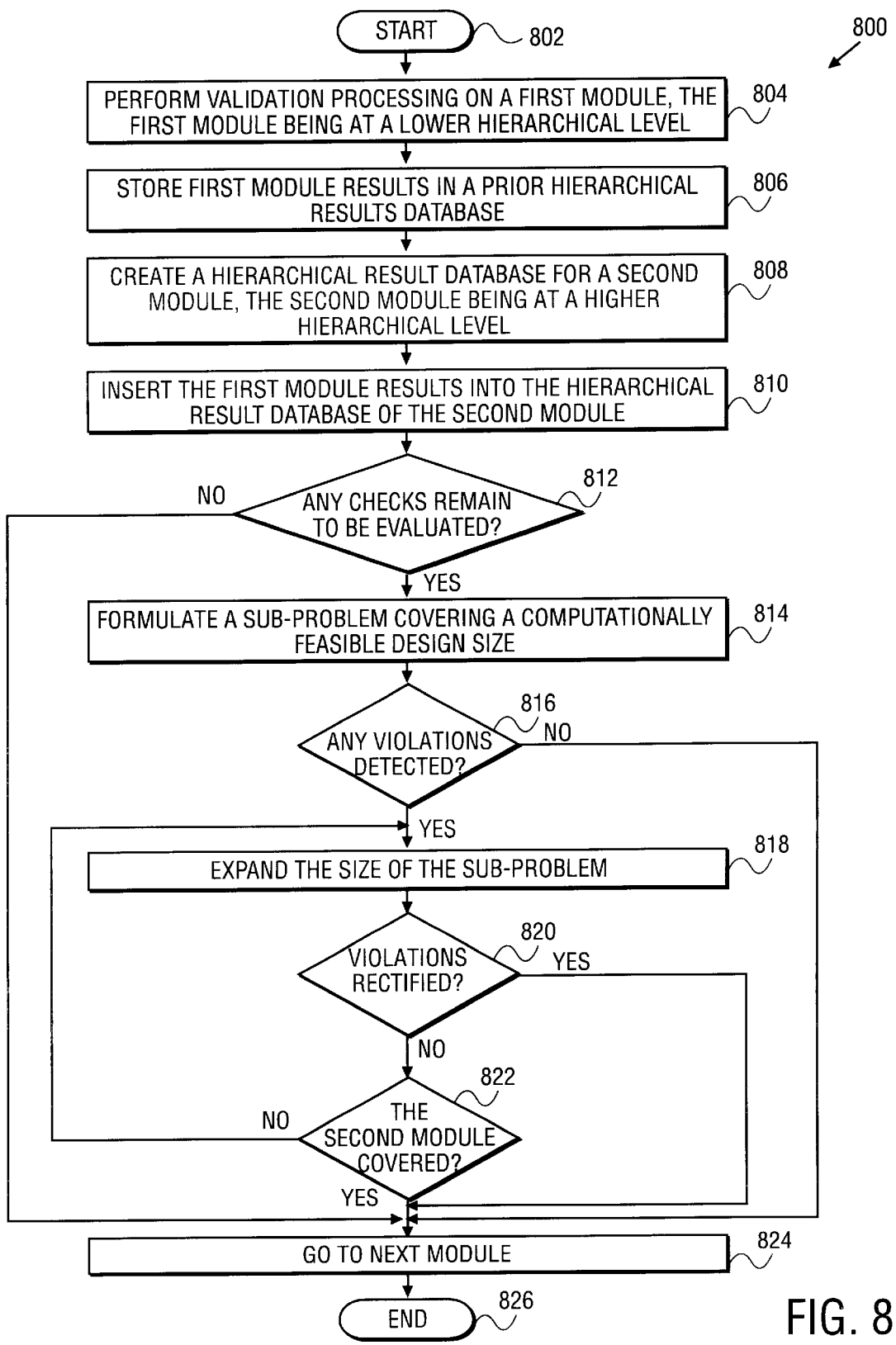
FIG. 8 is a flow diagram of one embodiment of a process for validating a hardware design using prior hierarchical results, according to one embodiment of the present invention.

FIG. 8 is a flow diagram of one embodiment of a process for validating a hardware design using prior hierarchical results, according to one embodiment of the present invention. At processing block 804, a first module located at a lower hierarchical level of the design is validated. The term "lower level" refers to any level of the design hierarchy, except the top level. In one embodiment, the first module is validated by evaluating a number of checks. As described above, the evaluation process determines whether each checks has passed or failed the evaluation process. At processing block 806, the evaluation results are stored in a prior hierarchical results database (e.g., the database 162) of the first module.

Further, when a second module located at a higher hierarchical level is validated, a hierarchical results database (e.g., the database 160) is created for the second module (processing block 808). The term "higher level" refers to any level of the design hierarchy, except the bottom level. In one embodiment, the checks that need to be evaluated for validating the second module are included in the database of the second module.

At processing block 810, the evaluation results of the first module are included in the database of the second module (processing block 810) if there is a hierarchical relationship between the first and second modules (i.e., the first module is a "child" of the second module). In one embodiment, some or all of the checks required for validation of the second module were previously evaluated during the validation of the first module. The checks that passed the evaluation of the first module are marked as "passed" in the database of the second module using the evaluation results from the database of the first module. In one embodiment, the second module inherits the evaluation results from two or more lower level modules. In this embodiment, all of the checks that passed the evaluation process of these lower level modules are marked as "passed" in the database of the second module.

At decision box 812, a determination is made as to whether further evaluation is needed to validate the second module. If the determination is negative (e.g., all the checks required to validate the second module have passed previous evaluation of lower level modules), the validation of the second module completes, and method 800 proceeds to processing block 824 where validation of the next module begins. Alternatively, if the determination is positive (e.g., some checks did not pass previous evaluation of lower level modules), a sub-problem of a computationally feasible design size is formulated (processing block 814) as described in detail above. In one embodiment, two or more sub-problems of computationally feasible design sizes are formulated.

Next, similarly to the process described in FIG. 6, the sub-problem is analyzed and a determination is made as to whether any conditions (e.g., checks) in the sub-problem are violated (decision box 816). If the determination is negative (i.e., no violations are detected), the validation of the second module ends, the database of the second modules is updated, and method 800 proceeds to processing block 824. Otherwise, if one or more violations are detected, the size of the sub-problem is expanded (processing block 818), and a determination is made as to whether any of the violations can be rectified within the extended context (processing block 820). If all the violations are rectified, the validation of the second module ends, the database of the second modules is updated, and method 800 proceeds to processing block 824. Alternatively, if some violations remain, a determination is made as to whether the entire design portion of the second module is covered (decision box 822). If the determination is negative, method 800 proceeds to processing block 822. If the determination is positive, the validation of the second module ends, and the validation process of the next module begins at processing block 824.

Figure 9A:
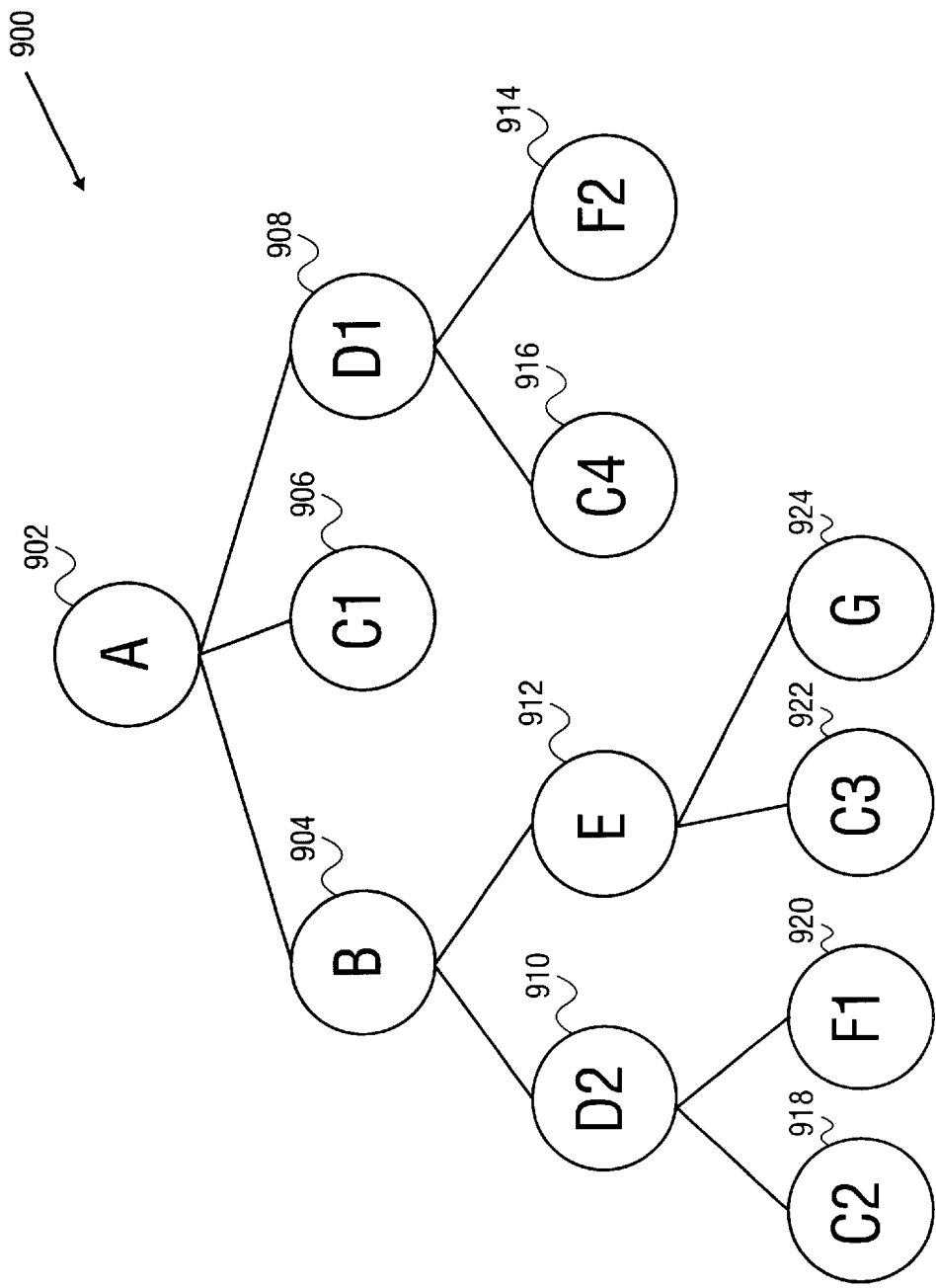
FIGS. 9A and 9B illustrate a process of building a hierarchical results database, according to one embodiment of the present invention.
Figure 9B:
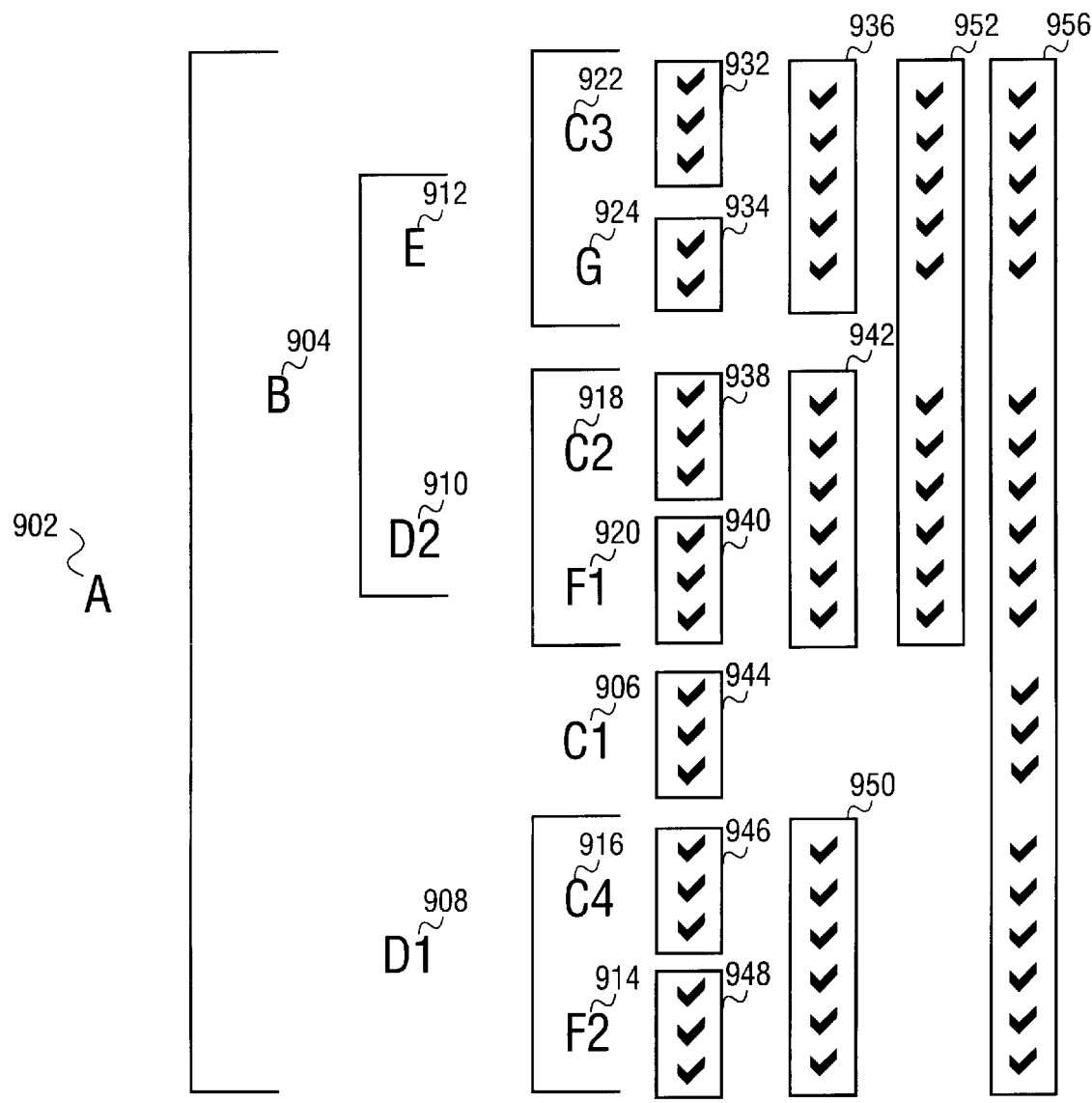

FIGS. 9A and 9B illustrate a process of validating a hierarchical hardware design, according to one embodiment of the present invention. FIG. 9A illustrates an exemplary hardware design 900 which includes multiple hierarchical levels, with one or more modules at each level. FIG. 9B illustrates one embodiment of a process for building a hierarchical result database for the design 900. In one embodiment, a hierarchical results database (e.g., the database 160) is built for each module within the design 900 during the validation of a corresponding module. When a higher level module is validated, a hierarchical results database built for a lower level module becomes a prior results database (e.g., the database 162). In another embodiment, one database (e.g., the database 160) is maintained to store prior evaluation results and current evaluation results of all the modules within the design 900.

As described above, validating a hardware design includes building a list of checks to detect the existence of potential errors in the hardware design. The list of checks includes all the checks that need to be verified to validate all the modules within the design 900. In one embodiment, the validation of the design 900 begins with singularly validating the modules located at the lowest level of the design hierarchy, i.e., modules 918–924. Each of the modules 918–924 covers a computationally feasible design size.

The validation of modules 918–924 may start by evaluating a set of checks 932 corresponding to a module 922. In one embodiment, a prior results database is created for the module 922 to store the information pertaining to the checks 932. Similarly, a module 924 is validated by evaluating checks 934 and storing the evaluation results in a prior results database created for the module 924. Modules 922 and 924 are the "children" of a module 912 which inherits their evaluation results in its own database. If all checks 932 and 934 have passed the evaluation of modules 922 and 924, no further validation of the module 912 is required. Alternatively, if some of these checks have failed the evaluation, the validation of the module 912 continues by combining modules 922 and 924 and analyzing the failed checks in the expanded context. The results of this analysis are included in the database of the module 912.

A module 918 does not need to be separately validated because it is identical to the module 922 and can inherit the evaluation results of the module 922. Similarly, modules 916 and 906 do not need to be validated and can inherit the evaluation results of the module 922. Thus, prior results databases can be created for modules 918, 916 and 906 by inheriting the evaluation results from the prior results database of the module 922. Next, a module 920 is validated by evaluating checks 940. A prior result database is created for the module 920 and updated with the evaluation results. A module 910 is a "parent" of modules 918 and 920. Thus, the database created for the module 910 inherits the evaluation results of modules 918 and 920. The validation of the module 910 is similar to the validation of module 912 described above. Further, a module 904 inherits the evaluation results of its "children": modules 912 and 910. If any checks were violated during the evaluation of the module 912, the modules 922 and 924 can be combined with the module 920 to rectify any of the violations. However, if not all of the violations are rectified, the remaining unrectified checks may be evaluated in the further expanded context created by combining modules 922 and 924 with the module 918. If yet some violations remain within the further expanded context, all four modules 918–924 can be combined to perform final evaluation of the still remaining checks. The evaluation results are stored in the database of the module 904.

A module 908 is identical to the module 910. Thus, the module 908 does not need to be validated and its database can inherit the evaluation results from the database of the module 910. A module 902 inherits evaluation results of modules 904, 906 and 908. If any checks did not pass the evaluations of modules 904–906, they are processed similarly to the checks of the module 904. The database of the module 902 includes the final results of validating the hardware design 900. Any checks that are recorded as failed in the database of the module 902 are reported as errors in the hardware design 900.

Linking

Figure 10:
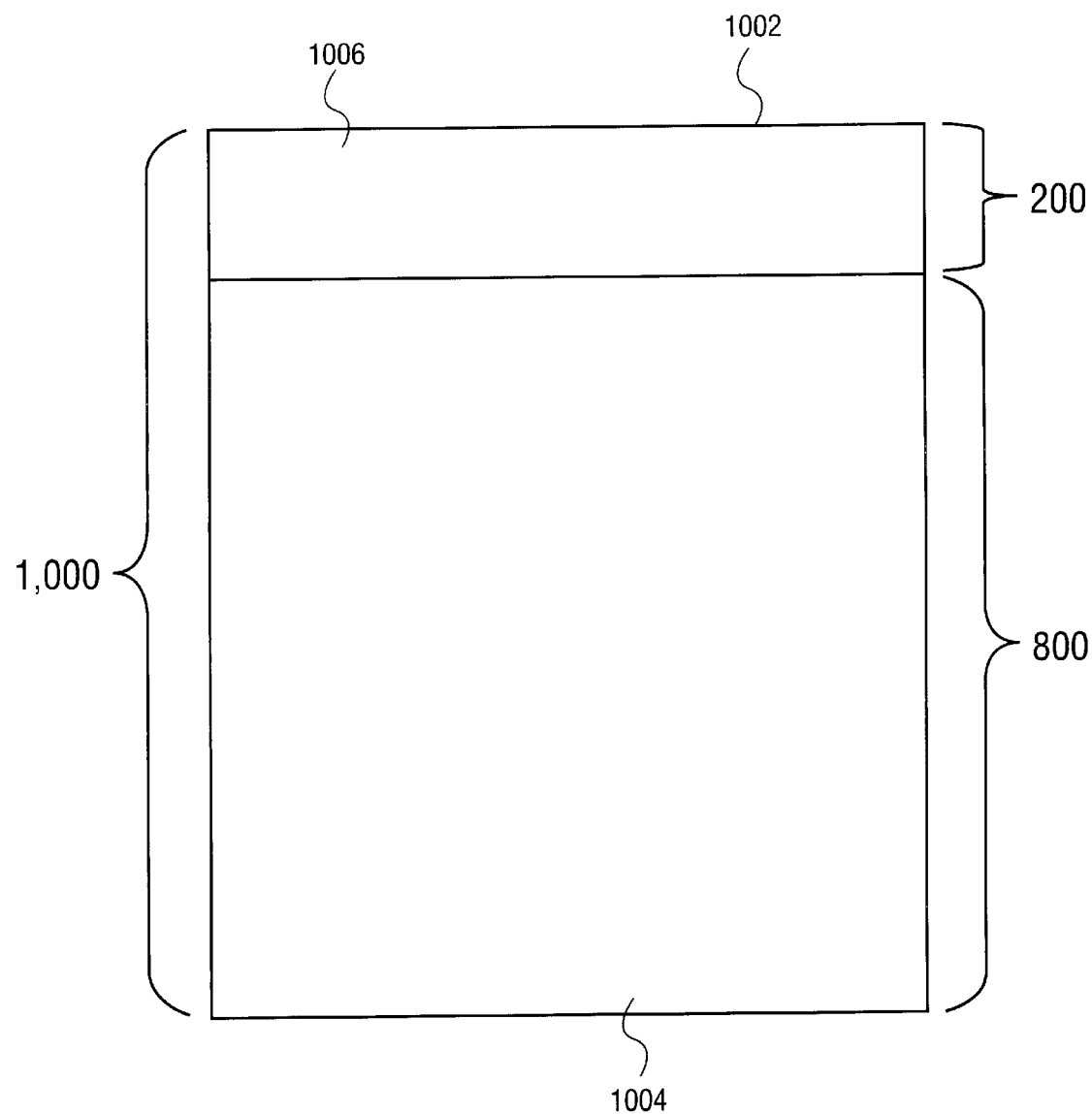
FIG. 10 is a block diagram that conceptually illustrates linking processing according to one embodiment of the present invention.

Validation of a hardware design can be optimized using a linking technique. FIG. 10 illustrates the use of linking in performing hierarchical functional verification of a hardware design, according to one embodiment of the present invention. In this embodiment, a list 1002 includes all the checks generated to validate a hardware design. For instance, the list 1002 may include 1,000 checks. The linking technique may be used to determine dependency relationships among the checks in the list 1002. That is, linking enables identification of each check within the list 1002 that is impossible to violate without violating one or more other checks from the list 1002. Using this linking information, it may be determined that each check in a portion 1004 of the list 1002 is impossible to violate without violating one or more checks in a portion 1006 of the list 1002. Accordingly, the evaluation of all the checks within the portion 1006 will determine an outcome for evaluation of any check within the portion 1004, thereby obviating the need to evaluate the checks within the portion 1004. As a result, the number of checks required to be evaluated for validating a hardware design can be significantly reduced. For instance, if the portion 1006 consists of 200 checks and the portion 1004 consists of 800 checks, only 200 checks (as opposed to 1,000 checks contained in the list 1002) will need to be evaluated to complete the evaluation process of the entire design.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of validating a hardware design, the method comprising:

receiving a representation of the hardware design, the hardware design including a plurality of modules having a hierarchical relationship, the representation including a plurality of variables with which logical signals are associated;

receiving information regarding intended flow of the logical signals among the plurality of variables;

automatically generating a plurality of checks based upon the representation of the hardware design and the information regarding the intended flow of the logical signals, each of the plurality of checks being symptomatic of one or more errors relating to the flow of one or more of the logical signals among the plurality of variables;

validating the hardware design by performing validation processing on the plurality of modules by making use of validation processing previously performed with respect to any of the plurality of modules based upon the hierarchical relationship, said making use of validation processing previously performed including:

identifying identical modules within the plurality of modules;

obtaining a result of validation processing performed with respect to one of the identical modules; and reusing the result for at least one other identical module of the identical modules.

2. The method of claim 1 wherein said making use of validation processing previously performed comprises:

obtaining a prior result of validation processing previously performed with respect to a first module, the first module being one of the plurality of modules at a lower hierarchical level of the hardware design; and inheriting the prior result when validating a second module, the second module being one of the plurality of modules at a higher hierarchical level of the hardware design.

3. The method of claim 2 further comprising:

creating a hierarchical result database for the second module;

retrieving the prior result from a database of prior hierarchical results pertaining to the first module;

inserting the prior result into the hierarchical result database of the second module; and maintaining current validation results pertaining to the second module in the hierarchical result database of the second module.

4. The method of claim 1 further comprising evaluating a list of checks from the plurality of checks at each hierarchical level of the hardware design, the each hierarchical level including one or more of the plurality of modules.

5. The method of claim 4 wherein said evaluating the list of checks further comprises:

when an evaluation result from a lower hierarchical level is available, eliminating one or more checks from the list of checks by inheriting the evaluation result; and analyzing remaining checks from the list of checks to determine whether one or more of the remaining checks are violated by the hardware design.

6. The method of claim 4 wherein the evaluation result identifies one or more checks that passed the evaluation at the lower level.

7. The method of claim 4 wherein said analyzing the remaining checks further comprises:

formulating a sub-problem that includes one or more of the remaining checks, the sub-problem representing a computationally feasible portion of the hardware design;

analyzing the sub-problem to detect any violation of the one or more of the remaining checks; and incrementally expanding a design size of the sub-problem to rectify any detected violation until the remaining checks are evaluated.

8. The method of claim 7 wherein the expanded design size represents a computationally feasible portion of the hardware design.

9. The method of claim 7 wherein the sub-problem covers one of the plurality of modules corresponding to the hierarchical level being processed.

10. The method of claim 7 wherein the sub-problem covers a pair of modules having a common interface, the pair of modules being a part of the plurality of modules and corresponding to the hierarchical level being processed.

11. The method of claim 1 further comprising utilizing linking to minimize the number of the plurality of checks being processed.

12. A method of validating a hardware design, the method comprising:

receiving a representation of the hardware design, the hardware design including a plurality of modules having a hierarchical relationship, the representation including a plurality of variables with which logical signals are associated;

receiving information regarding design intent associated with the representation of the hardware design;

automatically generating a plurality of checks based upon the representation of the hardware design and the information regarding design intent, each of the plurality of checks being symptomatic of one or more errors relating to the flow of one or more of the logical signals among the plurality of variables; and validating the hardware design by performing validation processing on the plurality of modules by making use of validation processing previously performed with respect to any of the plurality of modules based upon the hierarchical relationship, said making use of validation processing previously performed including:

identifying identical modules within the plurality of modules;

obtaining a result of validation processing performed with respect to one of the identical modules; and reusing the result for at least one other identical module of the identical modules.

13. The method of claim 12, wherein the design intent comprises implied design intent representing expected behaviors that should occur within standard design practices.

14. The method of claim 12, wherein the design intent comprises expressed design intent explicitly conveyed by a designer.

15. The method of claim 1, wherein the hardware design is expressed in a hardware description language (HDL), and wherein information regarding the intended flow of the logical signals is captured from semantics of the HDL.

16. The method of claim 1, wherein the intended flow of logical signals comprises intended functional behavior of the logical signals.

17. An apparatus for validating a hardware design, the apparatus comprising:

a storage device having stored therein one or more design analysis routines for verifying the design integrity of the hardware design including a plurality of modules having a hierarchical relationship; and a processor coupled to the storage device to execute the one or more design analysis routines that are to receive a representation of the hardware design that includes a plurality of variables with which logical signals are associated and validate the hardware design by performing validation processing on the plurality of modules including receiving information regarding intended flow of the logical signals among the plurality of variables, automatically generating a plurality of checks based upon the representation of the hardware design and the information regarding the intended flow of the logical signals, each of the plurality of checks being symptomatic of one or more errors relating to the flow of one or more of the logical signals among the plurality of variables, and making use of validation processing previously performed with respect to any of the plurality of modules based upon the hierarchical relationship, said making use of validation processing previously performed including:

identifying identical modules within the plurality of modules;

obtaining a result of validation processing performed with respect to one of the identical modules; and reusing the result for at least one other identical module of the identical modules.

18. The apparatus of claim 17 wherein said making use of validation processing previously performed comprises:

obtaining a prior result of validation processing previously performed with respect to a first module, the first module being one of the plurality of modules at a lower hierarchical level of the hardware design; and inheriting the prior result when validating a second module, the second module being one of the plurality of modules at a higher hierarchical level of the hardware design.

19. The apparatus of claim 18 wherein the one or more design analysis routines, when executed, further create a hierarchical result database for the second module, retrieve the prior result from a database of prior hierarchical results pertaining to the first module, insert the prior result into the hierarchical result database of the second module, and maintain current validation results pertaining to the second module in the hierarchical result database of the second module.

20. The apparatus of claim 17 wherein the one or more design analysis routines, when executed, further evaluate a list of checks from the plurality of checks at each hierarchical level of the hardware design, each of the hierarchical levels including one or more of the plurality of modules.

21. The apparatus of claim 20 wherein said evaluating the list of checks further comprises:
when an evaluation result from a lower hierarchical level is available, eliminating one or more checks from the list of checks by inheriting the evaluation result; and
analyzing remaining checks from the list of checks to determine whether one or more of the remaining checks are violated by the hardware design.

22. The apparatus of claim 20 wherein the evaluation result identifies one or more checks that passed the evaluation at the lower level.

23. The apparatus of claim 20 wherein said analyzing the remaining checks further comprises:
formulating a sub-problem that includes one or more of the remaining checks, the sub-problem covering a computationally feasible size of the hardware design;
analyzing the sub-problem to detect any violation of the one or more of the remaining checks; and
incrementally expanding a design size of the sub-problem to rectify any detected violation until the remaining checks are evaluated.

24. The apparatus of claim 23 wherein the expanded design size is computationally feasible.

25. The apparatus of claim 23 wherein the sub-problem covers one of the plurality of modules corresponding to the hierarchical level being processed.

26. The apparatus of claim 23 wherein the sub-problem covers a pair of modules having a common interface, the pair of modules being a part of the plurality of modules and corresponding to the hierarchical level being processed.

27. The apparatus of claim 17 wherein the one or more design analysis routines, when executed, further utilize linking to minimize the number of the plurality of checks being processed.

28. The apparatus of claim 17, wherein the hardware design is expressed in a hardware description language (HDL), and wherein information regarding the intended flow of the logical signals is captured from semantics of the HDL.

29. The apparatus of claim 17, wherein the intended flow of logical signals comprises intended functional behavior of the logical signals.

30. A method comprising:
receiving a representation of a hardware design, the representation including a plurality of modules having a hierarchical relationship, the representation including a plurality of variables with which logical signals are associated;
receiving information regarding intended flow of the logical signals among the plurality of variables;
automatically generating a plurality of checks based upon the representation of the hardware design and the information regarding the intended flow of the logical signals, each of the plurality of checks being symptomatic of one or more errors relating to the flow of one or more of the logical signals among the plurality of variables; and
validating the hardware design by performing validation processing on the plurality of modules including evaluating a list of checks from the plurality of checks at each hierarchical level of the representation of the hardware design, each hierarchical level including one or more of the plurality of modules, and making use of validation processing previously performed with respect to any of the plurality of modules based upon the hierarchical relationship by:
eliminating one or more checks from the list of checks by inheriting the evaluation result when an evaluation result from a lower hierarchical level is available; and
analyzing remaining checks from the list of checks to determine whether one or more of the remaining checks are violated by the hardware design.

31. The method of claim 30 wherein said making use of validation processing previously performed comprises:
obtaining a prior result of validation processing previously performed with respect to a first module, the first module being one of the plurality of modules at a lower hierarchical level of the representation of the hardware design; and
inheriting the prior result when validating a second module, the second module being one of the plurality of modules at a higher hierarchical level of the representation of the hardware design.

32. The method of claim 31 further comprising:
creating a hierarchical result database for the second module;
retrieving the prior result from a database of prior hierarchical results pertaining to the first module;
inserting the prior result into the hierarchical result database of the second module; and
maintaining current validation results pertaining to the second module in the hierarchical result database of the second module.

33. The method of claim 30 wherein said making use of validation processing previously performed comprises:
identifying identical modules within the plurality of modules;
obtaining a result of validation processing performed with respect to one of the identical modules; and
reusing the result for at least one other identical module of the identical modules.

34. The method of claim 30 wherein the evaluation result identifies one or more checks that passed the evaluation at the lower level.

35. The method of claim 30 wherein said analyzing the remaining checks further comprises:
formulating a sub-problem that includes one or more of the remaining checks, the sub-problem representing a computationally feasible portion of the hardware design;
analyzing the sub-problem to detect any violation of the one or more of the remaining checks; and
incrementally expanding a design size of the sub-problem to rectify any detected violation until the remaining checks are evaluated.

36. The method of claim 35 wherein the expanded design size represents a computationally feasible portion of the hardware design.

37. The method of claim 35 wherein the sub-problem covers one of the plurality of modules corresponding to the hierarchical level being processed.

38. The method of claim 35 wherein the sub-problem covers a pair of modules having a common interface, the pair of modules being a part of the plurality of modules and corresponding to the hierarchical level being processed.

39. The method of claim 30 further comprising utilizing linking to minimize the number of the plurality of checks being processed.

40. The method of claim 30, wherein the hardware design is expressed in a hardware description language (HDL), and wherein information regarding the intended flow of the logical signals is captured from semantics of the HDL.

41. The method of claim 30, wherein the intended flow of logical signals comprises intended functional behavior of the logical signals.

42. A method comprising:
receiving a representation of a hardware design, the representation including a plurality of modules having a hierarchical relationship and the representation including a plurality of variables with which logical signals are associated;
receiving information regarding intended flow of the logical signals among the plurality of variables;
automatically generating a plurality of checks based upon the representation of the hardware design and the information regarding the intended flow of the logical signals, each of the plurality of checks being symptomatic of one or more errors relating to the flow of one or more of the logical signals among the plurality of variables; and
validating the hardware design by performing validation processing on the plurality of modules including evaluating a list of checks from the plurality of checks at each hierarchical level of the representation of the hardware design, each hierarchical level including one or more of the plurality of modules, and making use of validation processing previously performed with respect to any of the plurality of modules based upon the hierarchical relationship by:
formulating a sub-problem that includes one or more of the remaining checks, the sub-problem representing a computationally feasible portion of the hardware design and covering a pair of modules having a common interface, the pair of modules being a part of the plurality of modules and corresponding to the hierarchical level being processed;
analyzing the sub-problem to detect any violation of the one or more of the remaining checks; and
rectifying any detected violation by incrementally expanding a design size of the sub-problem until the remaining checks are evaluated.

43. The method of claim 42 wherein said making use of validation processing previously performed comprises:
obtaining a prior result of validation processing previously performed with respect to a first module, the first module being one of the plurality of modules at a lower hierarchical level of the representation of the hardware design; and
inheriting the prior result when validating a second module, the second module being one of the plurality of modules at a higher hierarchical level of the representation of the hardware design.

44. The method of claim 43 further comprising:
creating a hierarchical result database for the second module;
retrieving the prior result from a database of prior hierarchical results pertaining to the first module;
inserting the prior result into the hierarchical result database of the second module; and
maintaining current validation results pertaining to the second module in the hierarchical result database of the second module.

45. The method of claim 42 wherein said making use of validation processing previously performed comprises:
identifying identical modules within the plurality of modules;
obtaining a result of validation processing performed with respect to one of the identical modules; and
reusing the result for at least one other identical module of the identical modules.

46. The method of claim 42 wherein said evaluating the list of checks further comprises:
when an evaluation result from a lower hierarchical level is available, eliminating one or more checks front the list of checks by inheriting the evaluation result; and
analyzing remaining checks from the list of checks to determine whether one or more of the remaining checks are violated by the hardware design.

47. The method of claim 46 wherein the evaluation result identifies one or more checks that passed the evaluation at the lower level.

48. The method of claim 42 wherein the expanded design size is computationally feasible.

49. The method of claim 42 further comprising utilizing linking to minimize the number of the plurality of checks being processed.

50. The method of claim 42, wherein the hardware design is expressed in a hardware description language (HDL), and wherein information regarding the intended flow of the logical signals is captured from semantics of the HDL.

51. The method of claim 42, wherein the intended flow of logical signals comprises intended functional behavior of the logical signals.

52. An apparatus comprising:
a storage device having stored therein one or more design analysis routines for verifying the design integrity of a hardware design including a plurality of modules having a hierarchical relationship;
a processor coupled to the storage device to execute the one or more design analysis routines that are to receive a representation of the hardware design that includes a plurality of variables with which logical signals are associated and validate the hardware design by:
receiving information regarding intended flow of the logical signals among the plurality of variables;
automatically generating a plurality of checks based upon the representation of the hardware design and the information regarding the intended flow of the logical signals, each of the plurality of checks being symptomatic of one or more errors relating to the flow of one or more of the logical signals among the plurality of variables; and
performing validation processing on the plurality of modules including evaluating a list of checks from the plurality of checks at each hierarchical level of the hardware design, each of the hierarchical levels including one or more of the plurality of modules, and making use of validation processing previously performed with respect to any of the plurality of modules based upon the hierarchical relationship including eliminating one or more checks from the list of checks by inheriting the evaluation result when an evaluation result from a lower hierarchical level is available, and determining whether one or more of the remaining checks are violated by the hardware design by analyzing remaining checks from the list of checks.

53. The apparatus of claim 52 wherein said making use of validation processing previously performed comprises:
   obtaining a prior result of validation processing previously performed with respect to a first module, the first module being one of the plurality of modules at a lower hierarchical level of the hardware design; and
   inheriting the prior result when validating a second module, the second module being one of the plurality of modules at a higher hierarchical level of the hardware design.

54. The apparatus of claim 52 wherein the one or more design analysis routines, when executed, further create a hierarchical result database for the second module, retrieve the prior result from a database of prior hierarchical results pertaining to the first module, insert the prior result into the hierarchical result database of the second module, and maintain current validation results pertaining to the second module in the hierarchical result database of the second module.

55. The apparatus of claim 52 wherein said making use of validation processing previously performed comprises:
   identifying identical modules within the plurality of modules;
   obtaining a result of validation processing performed with respect to one of the identical modules; and
   reusing the result for at least one other identical module of the identical modules.

56. The apparatus of claim 52 wherein the evaluation result identifies one or more checks that passed the evaluation at the lower level.

57. The apparatus of claim 52 wherein said analyzing the remaining checks further comprises:
   formulating a sub-problem that includes one or more of the remaining checks, the sub-problem representing a computationally feasible portion of the hardware design;
   analyzing the sub-problem to detect any violation of the one or more of the remaining checks; and
   rectifying any detected violation by incrementally expanding a design size of the sub-problem.

58. The apparatus of claim 57 wherein the expanded design size represents a computationally feasible portion of the hardware design.

59. The apparatus of claim 57 wherein the sub-problem covers one of the plurality of modules corresponding to the hierarchical level being processed.

60. The apparatus of claim 57 wherein the sub-problem covers a pair of modules having a common interface, the pair of modules being a part of the plurality of modules and corresponding to the hierarchical level being processed.

61. The apparatus of claim 52 wherein the one or more design analysis routines, when executed, further utilize linking to minimize the number of the plurality of checks being processed.

62. The apparatus of claim 52, wherein the hardware design is expressed in a hardware description language (HDL), and wherein information regarding the intended flow of the logical signals is captured from semantics of the HDL.

63. The apparatus of claim 52, wherein the intended flow of logical signals comprises functional behavior of the logical signals.

64. An apparatus comprising:
   a storage device having stored therein one or more design analysis routines for verifying the design integrity of a hardware design including a plurality of modules having a hierarchical relationship;
   a processor coupled to the storage device to execute the one or more design analysis routines that are to receive a representation of the hardware design that includes a plurality of variables with which logical signals are associated and validate the hardware design by:
      receiving information regarding intended flow of the logical signals among the plurality of variables;
      automatically generating a plurality of checks based upon the representation of the hardware design and the information regarding the intended flow of the logical signals, each of the plurality of checks being symptomatic of one or more errors relating to the flow of one or more of the logical signals among the plurality of variables; and
      performing validation processing on the plurality of modules including evaluating a list of checks from the plurality of checks at each hierarchical level of the hardware design, each of the hierarchical levels including one or more of the plurality of modules, and making use of validation processing previously performed with respect to any of the plurality of modules based upon the hierarchical relationship including eliminating one or more checks from the list of checks by (a) formulating a sub-problem that includes one or more remaining checks in the list of checks, the sub-problem representing a computationally feasible portion of the hardware design, the sub-problem covering a pair of modules having a common interface, the pair of modules being a part of the plurality of modules and corresponding to the hierarchical level being processed, (b) analyzing the sub-problem to detect any violation of the one or more of the remaining checks, and (c) rectifying any detected violation by incrementally expanding a design size of the sub-problem.

65. The apparatus of claim 64 wherein said making use of validation processing previously performed comprises:
   obtaining a prior result of validation processing previously performed with respect to a first module, the first module being one of the plurality of modules at a lower hierarchical level of the hardware design; and
   inheriting the prior result when validating a second module, the second module being one of the plurality of modules at a higher hierarchical level of the hardware design.

66. The apparatus of claim 64 wherein the one or more design analysis routines, when executed, further create a hierarchical result database for the second module, retrieve the prior result from a database of prior hierarchical results pertaining to the first module, insert the prior result into the hierarchical result database of the second module, and maintain current validation results pertaining to the second module in the hierarchical result database of the second module.

67. The apparatus of claim 64 wherein said making use of validation processing previously performed comprises:
   identifying identical modules within the plurality of modules;
   obtaining a result of validation processing performed with respect to one of the identical modules; and
   reusing the result for at least one other identical module of the identical modules.

68. The apparatus of claim 64 wherein said evaluating the list of checks further comprises:

when an evaluation result from a lower hierarchical level is available, eliminating one or more checks from the list of checks by inheriting the evaluation result; and analyzing remaining checks from the list of checks to determine whether one or more of the remaining checks are violated by the hardware design.

69. The apparatus of claim 68 wherein the evaluation result identifies one or more checks that passed the evaluation at the lower level.

70. The apparatus of claim 64 wherein the expanded design size represents a computationally feasible portion of the hardware design.

71. The apparatus of claim 64 wherein the one or more design analysis routines, when executed, further utilize linking to minimize the number of the plurality of checks being processed.

72. The apparatus of claim 64, wherein the hardware design is expressed in a hardware description language (HDL), and wherein information regarding the intended flow of the logical signals is captured from semantics of the HDL.

73. The apparatus of claim 64, wherein the intended flow of logical signals comprises intended functional behavior of the logical signals.

74. A method of validating a hardware design, the method comprising the steps of:
   a step for receiving a representation of the hardware design, the hardware design including a plurality of modules having a hierarchical relationship, the representation including a plurality of variables with which logical signals are associated;
   a step for receiving information regarding intended behavior of the logical signals;
   a step for automatically generating a plurality of checks based upon the representation of the hardware design and the information regarding the intended behavior of the logical signals, each of the plurality of checks being symptomatic of one or more errors relating to the behavior of one or more of the logical signals; and
   a step for validating the hardware design by performing validation processing on the plurality of modules by making use of validation processing previously performed with respect to any of the plurality of modules based upon tie hierarchical relationship, said making use of validation processing previously performed including:
      identifying identical modules within the plurality of modules;
      obtaining a result of validation processing performed with respect to one of the identical modules; and
      reusing the result for at least one other identical module of the identical modules.

75. The method of claim 74 wherein said making use of validation processing previously performed comprises the steps of:
   a step for obtaining a prior result of validation processing previously performed with respect to a first module, the first module being one of the plurality of modules at a lower hierarchical level of the hardware design; and
   a step for inheriting the prior result when validating a second module, the second module being one of the plurality of modules at a higher hierarchical level of the hardware design.

76. The method of claim 75 further comprising the steps of:
   a step for creating a hierarchical result database for the second module;
   a step for retrieving the prior result from a database of prior hierarchical results pertaining to the first module;
   a step for inserting the prior result into the hierarchical result database of the second module; and
   a step for maintaining current validation results pertaining to the second module in the hierarchical result database of the second module.

77. The method of claim 74 further comprising the step of evaluating a list of checks from the plurality of checks at each hierarchical level of the hardware design, the each hierarchical level including one or more of the plurality of modules.

78. The method of claim 77 wherein the evaluation result identifies one or more checks that passed the evaluation at the lower level.

79. The method of claim 77 wherein the step for analyzing the remaining checks further comprises the steps of:
   a step for formulating a sub-problem that includes one or more of the remaining checks, the sub-problem representing a computationally feasible portion of the hardware design;
   a step for analyzing the sub-problem to detect any violation of the one or more of the remaining checks; and
   a step for rectifying any detected violation by incrementally expanding a design size of the sub-problem until the remaining checks are evaluated.

80. The method of claim 79 wherein the expanded design size represents a computationally feasible portion of the hardware design.

81. The method of claim 79 wherein the sub-problem covers one of the plurality of modules corresponding to the hierarchical level being processed.

82. The method of claim 79 wherein the sub-problem covers a pair of modules having a common interface, the pair of modules being a part of the plurality of modules and corresponding to the hierarchical level being processed.

83. The method of claim 77 wherein the step of evaluating the list of checks further comprises:
   a step for eliminating one or more checks from the list of checks by inheriting the evaluation result when an evaluation result from a lower hierarchical level is available; and
   a step for analyzing remaining checks from the list of checks to determine whether one or more of the remaining checks are violated by the hardware design.

84. The method of claim 74 further comprising a step for utilizing linking to minimize the number of the plurality of checks being processed.

85. An apparatus comprising:
   a means for receiving a representation of the hardware design, the hardware design including a plurality of modules having a hierarchical relationship, the representation including a plurality of variables with which logical signals are associated; and
   a means for validating the hardware design by receiving information regarding intended behavior of the logical signals, automatically generating a plurality of checks based upon the representation of the hardware design and the information regarding the intended behavior of the logical signals, each of the plurality of checks being symptomatic of one or more errors relating to the behavior of one or more of the logical signals, and performing validation processing on the plurality of modules by making use of validation processing previously performed with respect to any of the plurality of modules based upon the hierarchical relationship, said making use of validation processing previously
performed including:
identifying identical modules within the plurality of
modules;
obtaining a result of validation processing performed
with respect to one of the identical modules; and
reusing the result for at least one other identical module
of the identical modules.

86. The apparatus of claim 85 wherein said making use of
validation processing previously performed comprises:
obtaining a prior result of validation processing previously performed with respect to a first module, the first
module being one of the plurality of modules at a lower
hierarchical level of the hardware design; and
inheriting the prior result when validating a second
module, the second module being one of the plurality
of modules at a higher hierarchical level of the hardware design.

87. A machine-readable medium having stored thereon
data representing instructions which, when executed by a
processor, cause the processor to:
receive a representation of the hardware design, the
hardware design including a plurality of modules having a hierarchical relationship;
receiving information regarding design intent associated
with the representation of the hardware design;
automatically generating a plurality of checks based upon
the representation of the hardware design and the
design intent, each of the plurality of checks being
symptomatic of one or more errors in the representation
of the hardware design; and
validate the hardware design by performing validation
processing on the plurality of modules by making use
of validation processing previously performed with
respect to any of the plurality of modules based upon
the hierarchical relationship, said making use of validation processing previously performed including:
identifying identical modules within the plurality of
modules;
obtaining a result of validation processing performed
with respect to one of the identical modules; and
reusing the result for at least one other identical module
of the identical modules.

88. The machine-readable medium of claim 87 wherein
said making use of validation processing previously performed comprises:
obtaining a prior result of validation processing previously performed with respect to a first module, the first
module being one of the plurality of modules at a lower
hierarchical level of the hardware design; and
inheriting the prior result when validating a second
module, the second module being one of the plurality
of modules at a higher hierarchical level of the hardware design.

89. The machine-readable medium of claim 88 wherein
the instructions further cause the processor to:
create a hierarchical result database for the second module;
retrieve the prior result from a database of prior hierarchical results pertaining to the fist module;
insert the prior result into the hierarchical result database
of the second module; and
maintain current validation results pertaining to the second module in the hierarchical result database of the
second module.

90. The machine-readable medium of claim 87 wherein
the instructions further cause the processor to evaluate a list
of checks from the plurality of checks at each hierarchical
level of the hardware design, the each hierarchical level
including one or more of the plurality of modules.

91. The machine-readable medium of claim 90 wherein
said evaluating the list of checks further comprises:
eliminating one or more checks from the list of checks by
inheriting the evaluation result when an evaluation
result from a lower hierarchical level is available; and
analyzing remaining checks from the list of checks to
determine whether one or more of the remaining checks
are violated by the hardware design.

92. The machine-readable medium of claim 90 wherein
the evaluation result identifies one or more checks that
passed the evaluation at the lower level.

93. The machine-readable medium of claim 90 wherein
said analyzing the remaining checks further comprises:
formulating a sub-problem that includes one or more of
the remaining checks, the sub-problem representing a
computationally feasible portion of the hardware
design;
analyzing the sub-problem to detect any violation of the
one or more of the remaining checks; and
rectifying any detected violation by incrementally
expanding a design size of the sub-problem until the
remaining checks are evaluated.

94. The machine-readable medium of claim 93 wherein
the expanded design size represents a computationally feasible portion of the hardware design.

95. The machine-readable medium of claim 93 wherein
the sub-problem covers one of the plurality of modules
corresponding to the hierarchical level being processed.

96. The machine-readable medium of claim 93 wherein
the sub-problem covers a pair of modules having a common
interface, the pair of modules being a part of the plurality of
modules and corresponding to the hierarchical level being
processed.

97. The machine-readable medium of claim 87 wherein
the instructions further cause the processor to utilizing
linking to minimize the number of the plurality of checks
being processed.

98. The machine-readable medium of claim 87, wherein
the representation includes a plurality of variables with
which logical signals are associated, and wherein the information regarding design intent comprises information
regarding intended flow of the logical signals among the
plurality of variables.

99. The machine-readable medium of claim 98, wherein
the design intent comprises implied design intent representing expected behaviors that should occur within standard
design practices.

100. The machine-readable medium of claim 98, wherein
the design intent comprises expressed design intent explicitly conveyed by a designer.

101. A method comprising:
receiving a representation of a hardware design, the
representation including a plurality of modules having
a hierarchical relationship;
receiving information regarding design intent associated
with the representation of the hardware design;
automatically generating a plurality of checks based upon
the representation of the hardware design and the
information regarding design intent, each of the plurality of checks being symptomatic of one or more
errors in the representation of the hardware design; and validating the hardware design by performing validation processing on the plurality of modules including evaluating a list of checks from the plurality of checks at each hierarchical level of the representation of the hardware design, each hierarchical level including one or more of the plurality of modules, and making use of validation processing previously performed with respect to any of the plurality of modules based upon the hierarchical relationship by:

eliminating one or more checks from the list of checks by inheriting the evaluation result when an evaluation result from a lower hierarchical level is available; and analyzing remaining checks from the list of checks to determine whether one or more of the remaining checks are violated by the hardware design.

102. The method of claim 101 wherein said making use of validation processing previously performed comprises:

obtaining a prior result of validation processing previously performed with respect to a first module, the first module being one of the plurality of modules at a lower hierarchical level of the representation of the hardware design; and inheriting the prior result when validating a second module, the second module being one of the plurality of modules at a higher hierarchical level of the representation of the hardware design.

103. The method of claim 102 further comprising:

creating a hierarchical result database for the second module;

retrieving the prior result from a database of prior hierarchical results pertaining to the first module;

inserting the prior result into the hierarchical result database of the second module; and maintaining current validation results pertaining to the second module in the hierarchical result database of the second module.

104. The method of claim 101 wherein said making use of validation processing previously performed comprises:

identifying identical modules within the plurality of modules;

obtaining a result of validation processing performed with respect to one of the identical modules; and reusing the result for at least one other identical module of the identical modules.

105. The method of claim 101 wherein the evaluation result identifies one or more checks that passed the evaluation at the lower level.

106. The method of claim 101 wherein said analyzing the remaining checks further comprises:

formulating a sub-problem that includes one or more of the remaining checks, the sub-problem representing a computationally feasible portion of the hardware design;

analyzing the sub-problem to detect any violation of the one or more of the remaining checks; and incrementally expanding a design size of the sub-problem to rectify any detected violation until the remaining checks are evaluated.

107. The method of claim 106 wherein the expanded design size represents a computationally feasible portion of the hardware design.

108. The method of claim 106 wherein the sub-problem covers one of the plurality of modules corresponding to the hierarchical level being processed.

109. The method of claim 106 wherein the sub-problem covers a pair of modules having a common interface, the pair of modules being a part of the plurality of modules and corresponding to the hierarchical level being processed.

110. The method of claim 101 further comprising utilizing linking to minimize the number of the plurality of checks being processed.

111. The method of claim 101, wherein the design intent comprises implied design intent representing expected behaviors that should occur within standard design practices.

112. The method of claim 101, wherein the design intent comprises expressed design intent explicitly conveyed by a designer.

113. A method comprising:

receiving a representation of a hardware design, the representation including a plurality of modules having a hierarchical relationship;

receiving information regarding design intent associated with the representation of the hardware design;

automatically generating a plurality of checks based upon the representation of the hardware design and the design intent, each of the plurality of checks being symptomatic of one or more errors in the representation of the hardware design; and validating the hardware design by performing validation processing on the plurality of modules including evaluating a list of checks from the plurality of checks at each hierarchical level of the representation of the hardware design, each hierarchical level including one or more of the plurality of modules, and making use of validation processing previously performed with respect to any of the plurality of modules based upon the hierarchical relationship by:

formulating a sub-problem that includes one or more remaining checks, the sub-problem representing a computationally feasible portion of the hardware design and covering a pair of modules having a common interface, the pair of modules being a part of the plurality of modules and corresponding to the hierarchical level being processed;

analyzing the sub-problem to detect any violation of the one or more remaining checks; and rectifying any detected violation by incrementally expanding a design size of the sub-problem until all remaining checks are evaluated.

114. The method of claim 113 wherein said making use of validation processing previously performed comprises:

obtaining a prior result of validation processing previously performed with respect to a first module, the first module being one of the plurality of modules at a lower hierarchical level of the representation of the hardware design; and inheriting the prior result when validating a second module, the second module being one of the plurality of modules at a higher hierarchical level of the representation of the hardware design.

115. The method of claim 114 further comprising:

creating a hierarchical result database for the second module;

retrieving the prior result from a database of prior hierarchical results pertaining to the first module;

inserting the prior result into the hierarchical result database of the second module; and maintaining current validation results pertaining to the second module in the hierarchical result database of the second module.

116. The method of claim 113 wherein said making use of validation processing previously performed comprises:
  identifying identical modules within the plurality of modules;
  obtaining a result of validation processing performed with respect to one of the identical modules; and
  reusing the result for at least one other identical module of the identical modules.

117. The method of claim 113 wherein said evaluating the list of checks further comprises:
  when an evaluation result from a lower hierarchical level is available, eliminating one or more checks from the list of checks by inheriting the evaluation result; and
  analyzing remaining checks from the list of checks to determine whether one or more of the remaining checks are violated by the hardware design.

118. The method of claim 117 wherein the evaluation result identifies one or more checks that passed the evaluation at the lower level.

119. The method of claim 113 wherein the expanded design size is computationally feasible.

120. The method of claim 113 further comprising utilizing linking to minimize the number of the plurality of checks being processed.

121. The method of claim 113, wherein the design intent comprises implied design intent representing expected behaviors that should occur within standard design practices.

122. The method of claim 113, wherein the design intent comprises expressed design intent explicitly conveyed by a designer.

123. A method comprising:
  receiving a representation of the hardware design, the hardware design including a plurality of modules having a hierarchical relationship, the representation including a plurality of variables with which logical signals are associated;
  receiving information regarding intended behavior of the logical signals;
  automatically generating a plurality of checks based upon the representation of the hardware design and the information regarding the intended behavior of the logical signals, each of the plurality of checks representing a condition that must hold true in order for the hardware design to operate in accordance with the intended behavior of the logical signals;
  validating the hardware design by performing validation processing on the plurality of modules by making use of validation processing previously performed with respect to any of the plurality of modules based upon the hierarchical relationship, said making use of validation processing previously performed including:
    identifying identical modules within the plurality of modules;
    obtaining a result of validation processing performed with respect to one of the identical modules; and
    reusing the result for at least one other identical module of the identical modules.

124. The method of claim 123 wherein said making use of validation processing previously performed comprises:
  obtaining a prior result of validation processing previously performed with respect to a first module, the first module being one of the plurality of modules at a lower hierarchical level of the hardware design; and
  inheriting the prior result when validating a second module, the second module being one of the plurality of modules at a higher hierarchical level of the hardware design.

125. The method of claim 124 further comprising:
  creating a hierarchical result database for the second module;
  retrieving the prior result from a database of prior hierarchical results pertaining to the first module;
  inserting the prior result into the hierarchical result database of the second module; and
  maintaining current validation results pertaining to the second module in the hierarchical result database of the second module.

126. The method of claim 123 further comprising evaluating a list of checks from the plurality of checks at each hierarchical level of the hardware design, the each hierarchical level including one or more of the plurality of modules.

127. The method of claim 126 wherein said evaluating the list of checks further comprises:
  when an evaluation result from a lower hierarchical level is available, eliminating one or more checks from the list of checks by inheriting the evaluation result; and
  analyzing remaining checks from the list of checks to determine whether one or more of the remaining checks are violated by the hardware design.

128. The method of claim 127 wherein the evaluation result identifies one or more checks that passed the evaluation at the lower level.

129. The method of claim 127 wherein said analyzing the remaining checks further comprises:
  formulating a sub-problem that includes one or more of the remaining checks, the sub-problem representing a computationally feasible portion of the hardware design;
  analyzing the sub-problem to detect any violation of the one or more of the remaining checks; and
  incrementally expanding a design size of the sub-problem to rectify any detected violation until the remaining checks are evaluated.

130. The method of claim 129 wherein the expanded design size represents a computationally feasible portion of the hardware design.

131. The method of claim 129 wherein the sub-problem covers one of the plurality of modules corresponding to the hierarchical level being processed.

132. The method of claim 129 wherein the sub-problem covers a pair of modules having a common interface, the pair of modules being a part of the plurality of modules. and corresponding to the hierarchical level being processed.

133. The method of claim 123 further comprising utilizing linking to minimize the number of the plurality of checks being processed.

134. The method of claim 123, wherein the hardware design is expressed in a hardware description language (HDL), and wherein information regarding the intended behavior of the logical signals is captured from semantics of the HDL.

135. A method comprising:
  receiving a representation of a hardware design, the representation including a plurality of modules having a hierarchical relationship, the representation including a plurality of variables with which logical signals are associated;
  receiving information regarding intended behavior of the logical signals;
  automatically generating a plurality of checks based upon the representation of the hardware design and the information regarding the intended behavior of the logical signals, each of the plurality of checks representing a condition that must hold true in order for the hardware design to operate in accordance with the intended behavior of the logical signals; and validating the hardware design by performing validation processing on the plurality of modules including evaluating a list of checks from the plurality of checks at each hierarchical level of the representation of the hardware design, each hierarchical level including one or more of the plurality of modules, and making use of validation processing previously performed with respect to any of the plurality of modules based upon the hierarchical relationship by:

eliminating one or more checks from the list of checks by inheriting the evaluation result when an evaluation result from a lower hierarchical level is available; and analyzing remaining checks from the list of checks to determine whether one or more of the remaining checks are violated by the hardware design.

136. The method of claim 135 wherein said making use of validation processing previously performed comprises:

obtaining a prior result of validation processing previously performed with respect to a first module, the first module being one of the plurality of modules at a lower hierarchical level of the representation of the hardware design; and inheriting the prior result when validating a second module, the second module being one of the plurality of modules at a higher hierarchical level of the representation of the hardware design.

137. The method of claim 136 further comprising:

creating a hierarchical result database for the second module;

retrieving the prior result from a database of prior hierarchical results pertaining to the first module;

inserting the prior result into the hierarchical result database of the second module; and maintaining current validation results pertaining to the second module in the hierarchical result database of the second module.

138. The method of claim 135 wherein said making use of validation processing previously performed comprises:

identifying identical modules within the plurality of modules;

obtaining a result of validation processing performed with respect to one of the identical modules; and reusing the result for at least one other identical module of the identical modules.

139. The method of claim 135 wherein the evaluation result identifies one or more checks that passed the evaluation at the lower level.

140. The method of claim 135 wherein said analyzing the remaining checks further comprises:

formulating a sub-problem that includes one or more of the remaining checks, the sub-problem representing a computationally feasible portion of the hardware design;

analyzing the sub-problem to detect any violation of the one or more of the remaining checks; and incrementally expanding a design size of the sub-problem to rectify any detected violation until the remaining checks are evaluated.

141. The method of claim 140 wherein the expanded design size represents a computationally feasible portion of the hardware design.

142. The method of claim 140 wherein the sub-problem covers one of the plurality of modules corresponding to the hierarchical level being processed.

143. The method of claim 140 wherein the sub-problem covers a pair of modules having a common interface, the pair of modules being a part of the plurality of modules and corresponding to the hierarchical level being processed.

144. The method of claim 135 further comprising utilizing linking to minimize the number of the plurality of checks being processed.

145. The method of claim 135, wherein the hardware design is expressed in a hardware description language (HDL), and wherein information regarding the intended behavior of the logical signals is captured from semantics of the HDL.

146. A method comprising:

receiving a representation of a hardware design, the representation including a plurality of modules having a hierarchical relationship and the representation including a plurality of variables with which logical signals are associated;

receiving information regarding intended behavior of the logical signals;

automatically generating a plurality of checks based upon the representation of the hardware design and the information regarding the intended behavior of the logical signals, each of the plurality of checks representing a condition that must hold true in order for the hardware design to operate in accordance with the intended behavior of the logical signals; and validating the hardware design by performing validation processing on the plurality of modules including evaluating a list of checks from the plurality of checks at each hierarchical level of the representation of the hardware design, each hierarchical level including one or more of the plurality of modules, and making use of validation processing previously performed with respect to any of the plurality of modules based upon the hierarchical relationship by:

formulating a sub-problem that includes one or more of the remaining checks, the sub-problem representing a computationally feasible portion of the hardware design and covering a pair of modules having a common interface, the pair of modules being a part of the plurality of modules and corresponding to the hierarchical level being processed;

analyzing the sub-problem to detect any violation of the one or more of the remaining checks; and rectifying any detected violation by incrementally expanding a design size of the sub-problem until the remaining checks are evaluated.

147. The method of claim 146 wherein said making use of validation processing previously performed comprises:

obtaining a prior result of validation processing previously performed with respect to a first module, the first module being one of the plurality of modules at a lower hierarchical level of the representation of the hardware design; and inheriting the prior result when validating a second module, the second module being one of the plurality of modules at a higher hierarchical level of the representation of the hardware design.

148. The method of claim 147 further comprising:

creating a hierarchical result database for the second module;

retrieving the prior result from a database of prior hierarchical results pertaining to the first module;

inserting the prior result into the hierarchical result database of the second module; and maintaining current validation results pertaining to the second module in the hierarchical result database of the second module.

149. The method of claim 146 wherein said making use of validation processing previously performed comprises:

identifying identical modules within the plurality of modules;

obtaining a result of validation processing performed with respect to one of the identical modules; and reusing the result for at least one other identical module of the identical modules.

150. The method of claim 146 wherein said evaluating the list of checks further comprises:

when an evaluation result from a lower hierarchical level is available, eliminating one or more checks from the list of checks by inheriting the evaluation result; and analyzing remaining checks from the list of checks to determine whether one or more of the remaining checks are violated by the hardware design.

151. The method of claim 150 wherein the evaluation result identifies one or more checks that passed the evaluation at the lower level.

152. The method of claim 146 wherein the expanded design size is computationally feasible.

153. The method of claim 146 further comprising utilizing linking to minimize the number of the plurality of checks being processed.

* * * * *